United States Patent [19]
Hachigo et al.

[11] Patent Number: 5,565,724
[45] Date of Patent: Oct. 15, 1996

[54] ORIENTATIONAL MATERIAL, ORIENTATIONAL SUBSTRATE AND SURFACE ACOUSTIC WAVE DEVICE

[75] Inventors: Akihiro Hachigo; Hideaki Nakahata; Kenjiro Higaki; Satoshi Fujii; Shin-ichi Shikata, all of Itami, Japan

[73] Assignee: Sumitomo Electric Industries, Ltd., Japan

[21] Appl. No.: 363,457

[22] Filed: Dec. 22, 1994

[30] Foreign Application Priority Data

Mar. 25, 1994 [JP] Japan ................................. 6-079883

[51] Int. Cl.$^6$ ................................................. H01L 41/08
[52] U.S. Cl. .......................... 310/313 A; 310/313 R; 310/360
[58] Field of Search ........................ 310/313 R, 313 A, 310/360

[56] References Cited

U.S. PATENT DOCUMENTS

| | | | |
|---|---|---|---|
| 5,127,983 | 7/1992 | Imai et al. | 156/610 |
| 5,334,855 | 8/1994 | Moyer et al. | 257/13 |
| 5,373,171 | 12/1994 | Imai et al. | 257/77 |
| 5,373,268 | 12/1994 | Dworsky et al. | 333/187 |
| 5,402,029 | 3/1995 | Nakamura et al. | 310/313 R |
| 5,419,969 | 5/1995 | Miyazaki et al. | 428/426 |
| 5,446,329 | 8/1995 | Nakahata et al. | 310/313 A |

FOREIGN PATENT DOCUMENTS

| | | | |
|---|---|---|---|
| 0435189 | 7/1991 | European Pat. Off. | H03H 9/02 |
| 0587068 | 3/1994 | European Pat. Off. | H03H 9/02 |
| 54-38874 | 11/1979 | Japan | H03H 9/00 |
| 1-62911 A | 3/1989 | Japan | H03H 9/25 |

OTHER PUBLICATIONS

Patent Abstracts of Japan, vol. 17, No. 434 (E–1412), Aug. 11, 1993 and JP–A–05 090888 (Sumitomo Electric Ind Ltd) Apr. 9, 1993.

Yamanouchi et al., "Saw Propagation Characteristics and Fabrication Technology of Piezoelectric Thin Film/Diamond Structure", Proceedings of the Ultrasonics Symposium, Montreal, Oct. 3–6, 1989, vol. 1, Oct. 1989, pp. 351–354.

Akio Hiraki and Hiroshi Kawarada "Diamond–Like Carbon Thin Films".

*Primary Examiner*—Thomas M. Dougherty
*Attorney, Agent, or Firm*—Pennie & Edmonds

[57] ABSTRACT

An orientational material including: diamond, and a ZnO film disposed on a surface of (111) orientational diamond provided by the diamond. Such an orientational material may suitably be used as a component for fabricating a surface acoustic wave device utilizing diamond.

25 Claims, 18 Drawing Sheets

Raman spectra of various phases of carbon (a) amorphous carbon  (b) graphite
(c) diamond ELECTRODE ELEMENT INTERSECTION WIDTH : w
ELECTRODE ELEMENT WIDTH : d Raman spectra of various phases of carbon (a) amorphous carbon  (b) graphite (c) diamond

- SHORT-CIRCUITING ELECTRODE
- ZnO
- INTERDIGITAL TRANSDUCER
- MONOCRYSTALLINE DIAMOND

- INTERDIGITAL TRANSDUCER
- ZnO
- DIAMOND EPITAXIAL LAYER
- MONOCRYSTALLINE DIAMOND (Si,SiC)

[10$\bar{1}$0] DIRECTION
ELECTRON BEAM INCIDENT DIRECTION

ZnO CRYSTAL (002) or (001) PLANE OF ZnO

WURTZITE CRYSTAL STRUCTURE

ZnO(0001)/DIAMOND(111)

ORIENTATIONAL MATERIAL, ORIENTATIONAL SUBSTRATE AND SURFACE ACOUSTIC WAVE DEVICE

BACKGROUND OF THE INVENTION

1. Field of the Invention

The present invention relates to an orientational material or substrate (i.e., a material comprising diamond with a surface of specific orientational diamond) which may suitably be used in a variety of devices such as dynamical (or mechanical), electric, electronic and optical devices utilizing diamond, and more particularly, to an orientational material or substrate comprising diamond and a layer comprising another substance disposed on a surface of the diamond having a specific orientational property, and a surface acoustic wave device (hereinafter, referred to as "SAW device") utilizing the orientational substrate. Such a SAW device may suitably be used for an electric, electronic or optical device such as high-frequency filter.

2. Related Background Art

Diamond is used in a variety of devices utilizing its dynamical, electric, electronic or optical characteristic. Specific examples of such a device utilizing diamond may include a SAW device which may suitably be used for a high-frequency filter, etc.

Heretofore, as the SAW device, there is known one having a multilayered structure comprising a diamond thin film and a combination of an electrode and a piezoelectric material disposed on the diamond thin film as shown in Japanese Patent Publication (KOKOKU) No. 38874/1979 (i.e., Sho 54-38874) and Japanese Laid-Open Patent Application (KOKAI) No. 62911/1989 (i.e., Sho 64-62911).

However, in the above-mentioned conventional SAW device utilizing a diamond thin film, when a layer comprising a piezoelectric substance is formed on the diamond thin film, the resultant device utilizing diamond is liable to cause a large propagation loss of surface acoustic wave (hereinafter, referred to as "SAW").

SUMMARY OF THE INVENTION

An object of the present invention is to provide a novel orientational material or orientational substrate which may suitably be used for a device utilizing diamond such as SAW device.

Another object of the present invention is to provide a SAW device utilizing diamond, which may reduce propagation loss of SAW.

As a result of earnest study, the present inventors have found that when a film comprising a specific piezoelectric substance, etc., is disposed on a diamond surface having a specific orientational property, a high c-axis orientational property may easily be obtained. As a result of further study based on such a discovery, the present inventors have also found that the formation of a layer comprising a specific piezoelectric substance, etc., having such a high c-axis orientational property on the above-mentioned surface of diamond having the specific orientational property is very effective in achieving the above-mentioned object.

The material according to the present invention is based on the above discovery and comprises: diamond, and a ZnO film disposed on a surface of (111) orientational diamond provided by the diamond.

The present invention also provides a substrate comprising: a diamond layer, and a ZnO film disposed on a surface of (111) orientational diamond provided by the diamond layer.

The present invention further provides a surface acoustic wave device, comprising: a diamond layer, a ZnO film disposed on a surface of (111) orientational diamond provided by the diamond layer, and an interdigital transducer disposed on the ZnO film.

The present invention further provides a surface acoustic wave device, comprising: a diamond layer, an interdigital transducer disposed on a surface of (111) orientational diamond provided by the diamond layer, and a ZnO film disposed on the interdigital transducer.

The present invention further provides a surface acoustic wave device, comprising: a diamond layer, an interdigital transducer comprising semiconductive diamond and disposed on a surface of (111) orientational diamond provided by the diamond layer, and a ZnO film disposed on the interdigital transducer.

The present invention further provides a surface acoustic wave device, comprising: a diamond layer; an interdigital transducer comprising a conductive substance and disposed in an indentation of a surface of (111) orientational diamond provided by the diamond layer; and a ZnO film disposed on the interdigital transducer.

The present invention further provides a surface acoustic wave device, comprising: a diamond layer; a short-circuiting electrode disposed on a surface of (111) orientational diamond provided by the diamond layer; a ZnO film disposed on the short-circuiting electrode; and an interdigital transducer disposed on the ZnO film.

The present invention further provides a surface acoustic wave device, comprising: a diamond layer; a ZnO film disposed on a surface of (111) orientational diamond provided by the diamond layer; an upper layer comprising at least one substance selected from the group consisting of $SiO_2$, diamond and diamond-like carbon, which is disposed on the ZnO film; and an interdigital transducer disposed on the upper layer.

The present invention further provides a surface acoustic wave device, comprising: a diamond layer; a short-circuiting electrode disposed on a surface of (111) orientational diamond provided by the diamond layer; a ZnO film disposed on the short-circuiting electrode; an upper layer comprising at least one substance selected from the group consisting of $SiO_2$, diamond, and diamond-like carbon, which is disposed on the ZnO film; and an interdigital transducer disposed on the upper layer.

The present invention further provides a surface acoustic wave device, comprising: a diamond layer; a ZnO film disposed on a surface of (111) orientational diamond provided by the diamond layer; a short-circuiting electrode disposed on the ZnO film; an upper layer comprising at least one substance selected from the group consisting of $SiO_2$, diamond, and diamond-like carbon, which is disposed on the short-circuiting electrode; and an interdigital transducer disposed on the upper layer.

The present invention further provides a surface acoustic wave device, comprising: a diamond layer; a first ZnO film disposed on a surface of (111) orientational diamond provided by the diamond layer; an interdigital transducer disposed on the first ZnO film; and a second ZnO film disposed on the interdigital transducer.

The term "surface of (111) orientational diamond" used herein has a meaning such that it includes both a surface of (111) plane of monocrystalline diamond, and a surface of polycrystalline diamond (or diamond film) having <111>orientational property. The monocrystalline diamond for providing the above-mentioned surface of (111) plane may comprise either of natural diamond crystal, high pressure-synthesized diamond crystal, and an epitaxial diamond film.

In the orientational material, orientational substrate or SAW device according to the present invention, in a case where a ZnO film is formed on a surface of monocrystalline or polycrystalline diamond substrate having a (111) orientational property, there may be provided a higher c-axis orientational property as compared with that of a ZnO film formed on a surface of diamond having an orientational property other than (111).

According to the present inventors' investigation, the above-mentioned ZnO film to be used in the present invention has a wurtzite structure, and the crystal structure of Zn in the (001) plane (i.e., a plane perpendicular to c-axis) has an arrangement or configuration similar to that of the (111) plane of diamond, as compared with that of a plane of diamond having an orientation other than (111), and it is presumed that the crystal faces of the ZnO and diamond are liable to align with each other. Accordingly, in the present invention, it is presumed that the ZnO film formed on the (111) face of diamond may be caused to have a higher c-axis orientation.

Further, according to the present inventors' investigation, it is presumed that the above-mentioned ZnO film having a high c-axis orientation may have a good crystallinity, and the scattering of SAW at grain boundary may be reduced, whereby the propagation loss of SAW can be reduced.

In addition, according to the present inventors' experiments, it has been found that the surface of the ZnO thin film formed on the diamond surface having the (111) orientational property has a higher surface flatness than that of a ZnO thin film formed on a surface of diamond having an orientational property other than (111). Also from such a viewpoint, it is presumed that the surface of the ZnO thin film formed on the diamond surface having the (111) orientational property may reduce the scattering of SAW due to surface unevenness (i.e., indentations and protrusions of surface) as compared with that at the surface of a ZnO thin film formed on the a surface of diamond having an orientational property other than (111), and such reduction in the scattering may contribute to reduction in propagation loss.

Further objects and advantages of the present invention will be apparent from the description of the preferred embodiments with the accompanying drawings.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS (Diamond)

Figure 1:
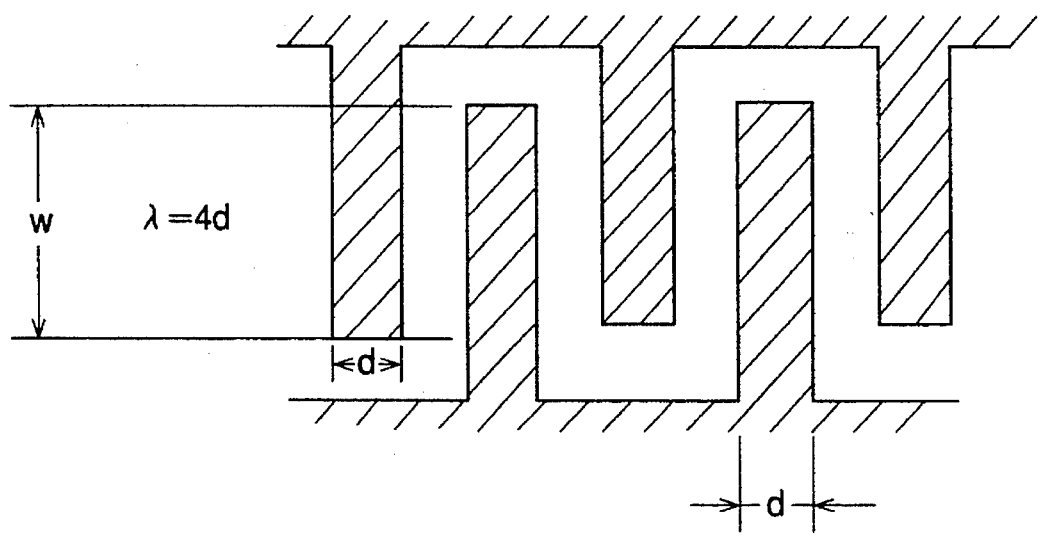
FIG. 1 is a schematic plan view showing an example (single-type electrode) of the planar shape of an interdigital transducer (i.e., an electrode having a comb-like shape, hereinafter, referred to as "IDT") constituting a SAW device.

As the diamond for providing a surface of (111) orientational diamond, either of monocrystalline (or single-crystalline) diamond and/or polycrystalline diamond may be used. In other words, in the present invention, the term "surface of (111) orientational diamond" has a meaning such that it includes both a surface of (111) plane of monocrystalline diamond, and a surface of polycrystalline diamond (or polycrystalline diamond film) having <111>orientational property.

In an embodiment of the present invention wherein the diamond for providing the surface of (111) orientational diamond comprises monocrystalline diamond, it is easy to obtain diamond having little crystal (or lattice) defect due to good lattice matching. In such an embodiment, it is easier to obtain a SAW device with a small propagation loss.

On the other hand, in an embodiment of the present invention wherein the diamond for providing the surface of (111) orientational diamond comprises polycrystalline diamond, it is easy to use an inexpensive base substance on which the polycrystalline diamond is to be disposed or deposited.

In addition, in an embodiment of the present invention wherein the diamond for providing the surface of (111) orientational diamond comprises an epitaxial (particularly, hetero-epitaxial) diamond layer, it is easy to use a base substance having a large area on which the epitaxial or hetero-epitaxial diamond is to be disposed or deposited. In such an embodiment, it is easy to obtain a SAW device with a relatively small propagation loss.

As long as the diamond for providing a surface on which the ZnO film is to be disposed has a (111) orientational property, the process or method for providing such a surface of diamond is not particularly limited. More specifically, for example, a (111) face of monocrystalline diamond as such may be used as the surface of a (111) orientational property. Alternatively, a diamond layer may be epitaxially grown on another substance (base substance), and the surface of the resultant diamond film may be used as the surface of (111) orientational diamond.

The shape (two-dimensional shape and/or three-dimensional shape) and size of the diamond for providing the surface of diamond with a (111) orientational property are not particularly limited, but may be appropriately selected in accordance with the application or usage of the orientational material or substrate according to the present invention.

In the present invention, in a case where the diamond for providing the above-mentioned surface of (111) orientational diamond comprises a diamond film or layer, the process or method of growing the diamond (thin) film is not particularly limited. More specifically, the growth process to be used for such a purpose may appropriately be selected from known processes inclusive of: a CVD (Chemical Vapor Deposition) method, a microwave plasma CVD method, a PVD (Physical Vapor Deposition) method, a sputtering method, an ion plating method, a plasma jet method, a flame method, a hot filament method, etc.

The diamond for providing the surface of (111) orientational diamond may be either insulating diamond or semiconductive (or conductive) diamond. In the present invention, the above-mentioned "insulating diamond" is diamond having a volume resistivity exceeding $10^6$ Ω·cm, and the above-mentioned "semiconductive diamond" is diamond having a volume resistivity of $10^6$ Ω·cm or less.

The method of providing the semiconductive (or conductive) diamond is not particularly limited. For example, the semiconductive diamond may be provided by hydrogenation of diamond, doping of diamond with an impurity, or introduction of a lattice defect into diamond, etc.

(Orientational property of Diamond)

As described above, according to the present inventors' investigation, when a monocrystalline film, a polycrystalline film, or a film having an epitaxial growth property (e.g., a ZnO film) is formed on a surface of (111) orientational diamond, the resultant film shows a highest orientation.

In the present invention, the orientational property of the above-mentioned "(111) orientational diamond" may be evaluated on the basis of comparison between a diffraction intensity based on a (111) plane in diffraction intensity provided by X-ray diffraction, and a diffraction intensity based on the other plane (or planes). In such X-ray diffraction, for example, there can be used an ordinary technique utilizing Cu—Kα ray (1.54 Å (angstrom)) as monochromatic or homogeneous X-ray.

More specifically, the (111) orientational property of diamond may be evaluated in the following manner.

Thus, in the diffraction intensities provided by the X-ray diffraction of polycrystalline diamond, etc., the diffraction intensity based on a (111) plane and the diffraction intensity based on the other plane or planes (e.g., (220) and (400) planes) are measured. The thus measured diffraction intensity of the other plane is normalized in such a manner that the intensity of the (111) plane is 100 (i.e., relative intensities are determined with respect to the (111) plane intensity which is equal to 100). Then, a sum of the diffraction intensities based on the planes other than (111) plane is calculated with respect to the diffraction intensity of (111) plane (i.e., 100). In the present invention, the sum of the normalized diffraction intensities based on the planes other than (111) plane may preferably be 25 or less, in view of a good orientational property (in the case of a ZnO film, c-axis orientation) of a film of a substance to be formed on the face of diamond having a (111) orientational property.

(ZnO film)

In the present invention, the ZnO film to be formed on the above surface of (111) orientational diamond may be monocrystalline or polycrystalline. The thickness of the ZnO film may appropriately be selected in accordance with the application or usage of the orientational material or substrate according to the present invention, and the thickness thereof is not particularly limited.

In a case where the orientational material or substrate according to the present invention is used as a component of a SAW device, when the thickness of the ZnO film is denoted by h (Å), and a wavelength to be used as the SAW device is denoted by λ (Å), the thickness of the ZnO film may preferably be selected in a manner such that the values h and λ fall within a range satisfying a relationship of $2\pi \cdot h/\lambda = 0.3$ to 2.5. When the above values fall within such a range satisfying $2\pi \cdot h/\lambda = 0.3$ to 2.5, both of the electromechanical coupling coefficient (preferably, 0.5% or more) and propagation velocity of the SAW device can easily be caused to fall within preferable ranges, respectively.

In an embodiment wherein two ZnO films (i.e., first and second ZnO films) are formed, the above description relating to ZnO film is basically applicable to the first ZnO film. However, the second ZnO film (the ZnO film to be formed on an IDT) may be formed in the same manner as in the first ZnO film. In such an embodiment, the sum of the thicknesses of the first and second ZnO films is denoted by $h_t$ (Å), and a wavelength to be used as a SAW device is denoted by λ (Å). In this case, the thickness of each ZnO film may preferably be selected in a manner such that the values $h_t$ and λ fall within a range satisfying a relationship of $2\pi \cdot h/\lambda = 0.3$ to 2.5. When the above values fall within such a range of $2\pi \cdot h/\lambda = 0.3$ to 2.5, the electromechanical coupling coefficient (preferably, 0.5% or more) and propagation speed of the SAW device can easily fall within desired ranges, respectively.

(Orientational property of ZnO Film)

In the present invention, the orientational property of a ZnO film may be evaluated by, e.g., an X-ray rocking (curve) pattern method, as one of the methods of evaluating the orientational property of a crystal face or crystal plane. More specifically, the orientational property (in-plane orientational property) may be evaluated in the following manner.

(1) A sample to be measured is located in a sample holder of an X-ray diffractometer.

(2) The plane orientation of a face to be evaluated is measured by using an X-ray diffraction pattern method Utilizing the above-mentioned X-ray diffractometer.

(3) The θ-axis (corresponding to the rotation of the sample to be measured) and the 2θ-axis (corresponding to an X-ray counter of the X-ray diffractometer) are rotated and then fixed so that the θ-and 2θ-axes provide a maximum output value in orientation of the face to be evaluated. In the case of a ZnO film of which c-axis is oriented perpendicularly to a base substance on which the ZnO film is to be disposed, 2θ is 34.4° and θ is 17.2°.

(4) Only the sample (i.e., the θ-axis) is rotated and a rocking curve is measured.

(5) The thus obtained rocking curve is regarded as one having a Gaussian distribution, and a standard deviation σ thereof is determined.

As the standard deviation σ of the rocking curve measured as described above is decreased, it indicates a higher orientational property of the sample to be evaluated. The deviation σ may preferably be 5 or less in the orientational material or substrate, or SAW device according to the present invention.

(IDT)

In the SAW device according to the present invention, the substance to be used for the IDT is not particularly limited as long as it comprises an electroconductive substance. In view of processability or workability and production cost, Al (aluminum) may particularly preferably be used as the substance constituting the IDT.

The thickness of the IDT is not particularly limited, as long as it functions as an IDT of a SAW device. In general, the thickness of the IDT may preferably be in the range of about 100 to 3,000 Å (more preferably, about 100 to 500 Å). When the thickness of the IDT is less than 100 Å, the electrode resistivity is increased to cause an increase in loss. On the other hand, when the thickness of the IDT exceeds 3,000 Å, it provides a considerable mass addition effect which is liable to cause reflection of SAW due to the thickness and height of the electrode, and it becomes difficult to obtain a desired SAW characteristic of the SAW device.

The planar or two-dimensional shape of the IDT is not particularly limited, as long as it may function as an IDT of the SAW device. As the IDT, a so-called "single-type" electrode as shown in the schematic plan view of FIG. 1 or a so-called "double-type" electrode as shown in the schematic plan view of FIG. 2 may preferably be used.

As desired, the above-mentioned IDT may be embedded in a surface (e.g., a surface of diamond having a (111)

orientational property) on which the IDT is to be formed. More specifically, for example, a recessed or indented portion having a shape such as groove may be formed (or a predetermined surface having a recessed portion may be formed in advance), and at least a part of (i.e., all or a part of) a conductive substance, such as Al constituting the IDT may be embedded in the recessed portion. When all or a part of the IDT is embedded in this manner, for example, the surface level or height of the IDT can be made substantially equal to the surface on which the IDT is to be formed. As a result, an influence of SAW reflection caused by the thickness of the IDT can be reduced.

(Short-Circuiting Electrode)

In the SAW device according to the present invention, the short-circuiting electrode to be formed as desired, is an electrode having a function of providing an equipotential state to an electric field so as to change the SAW characteristic of the device. This electrode may preferably comprise a (thin) film of a metal such as Al, Au and Al—Cu. Since the short-circuiting electrode has a function different from that of the IDT as described above, the substance constituting the short-circuiting electrode is not necessarily the same as that of the IDT.

The thickness of the short-circuiting electrode is not particularly limited as long as it may function as a short-circuiting electrode of a SAW device. The thickness of the short-circuiting electrode may preferably be in the range of about 100 to 3,000 Å (more preferably, about 100 to 500 Å). When the thickness is less than 100 Å, it is difficult to obtain an equipotential state as described above. On the other hand, when the thickness exceeds 3,000 Å, it is liable to affect the reflection of SAW.

For example, the short-circuiting electrode may preferably has a two-dimensional shape as a "solid electrode" having an area substantially equal to that of the IDT to be used in combination therewith. (Upper layer of $SiO_2$, etc.)

In the SAW device according to the present invention, a layer (upper layer) comprising at least one substance selected from the group consisting of $SiO_2$, diamond, and diamond-like carbon may be formed, as desired. Such a layer of $SiO_2$, etc., may also have a function of a protective layer.

When an $SiO_2$ (thin) film is formed on the ZnO film, the temperature coefficient may be reduced, and/or the electromechanical coupling coefficient as an indication of efficiency may easily be increased.

When the thickness of the $SiO_2$ film is denoted by $h_s$ (Å), and a wavelength to be used in a SAW device is denoted by $\lambda$ (Å), the thickness of the $SiO_2$ film may preferably be selected in a manner such that the values $h_s$ and $\lambda$ fall within the range satisfying a relationship of $2\pi \cdot h_s/\lambda = 0.8$ or less. The thickness of the $SiO_2$ film may preferably have an absolute value of 50 Å or more (more preferably 1,000 Å or more).

On the other hand, when a diamond thin film or diamond-like carbon film is formed on the ZnO film, the propagation velocity can be increased, and at the same time, a large electromechanical coupling coefficient can easily be obtained.

When the thickness of the diamond or diamond-like carbon film is denoted by $h_d$ (Å), and a wavelength to be used in a SAW device is denoted by $\lambda$ (Å), the thickness of the diamond or diamond-like carbon film may preferably be selected in a manner such that the values $h_d$ and $\lambda$ fall within the range satisfying a relationship of $2\pi \cdot h_d/\lambda = 0.8$ or less. When the thickness of the diamond or diamond-like carbon film is excessively large, the efficiency is liable to be decreased due to an influence of mass of these substances. The thickness of the diamond or diamond-like carbon film may preferably has an absolute value of 50 Å or more.

(Diamond-Like Carbon)

Diamond-like carbon (DLC) constituting the above diamond-like carbon film is an amorphous material having a high hardness. The diamond-like carbon has an excellent stability and comprises carbon atoms which are the same as those constituting diamond. Accordingly, the diamond-like carbon has an advantage such that atomic or elemental diffusion therefrom to diamond, or a reaction thereof with diamond is substantially negligible. For this reason, the diamond-like carbon can suitably be used as an insulating substance for forming an upper layer (e.g., insulating film) to be formed in the SAW device, as desired.

The diamond-like carbon (sometimes called as "i-carbon" or "amorphous carbon") to be used herein is a substance having the following properties.

(1) In general, diamond-like carbon contains hydrogen atoms in addition to carbon atoms. In this case, the number of moles of hydrogen may preferably be smaller than the number of moles of carbon.

Figure 3:
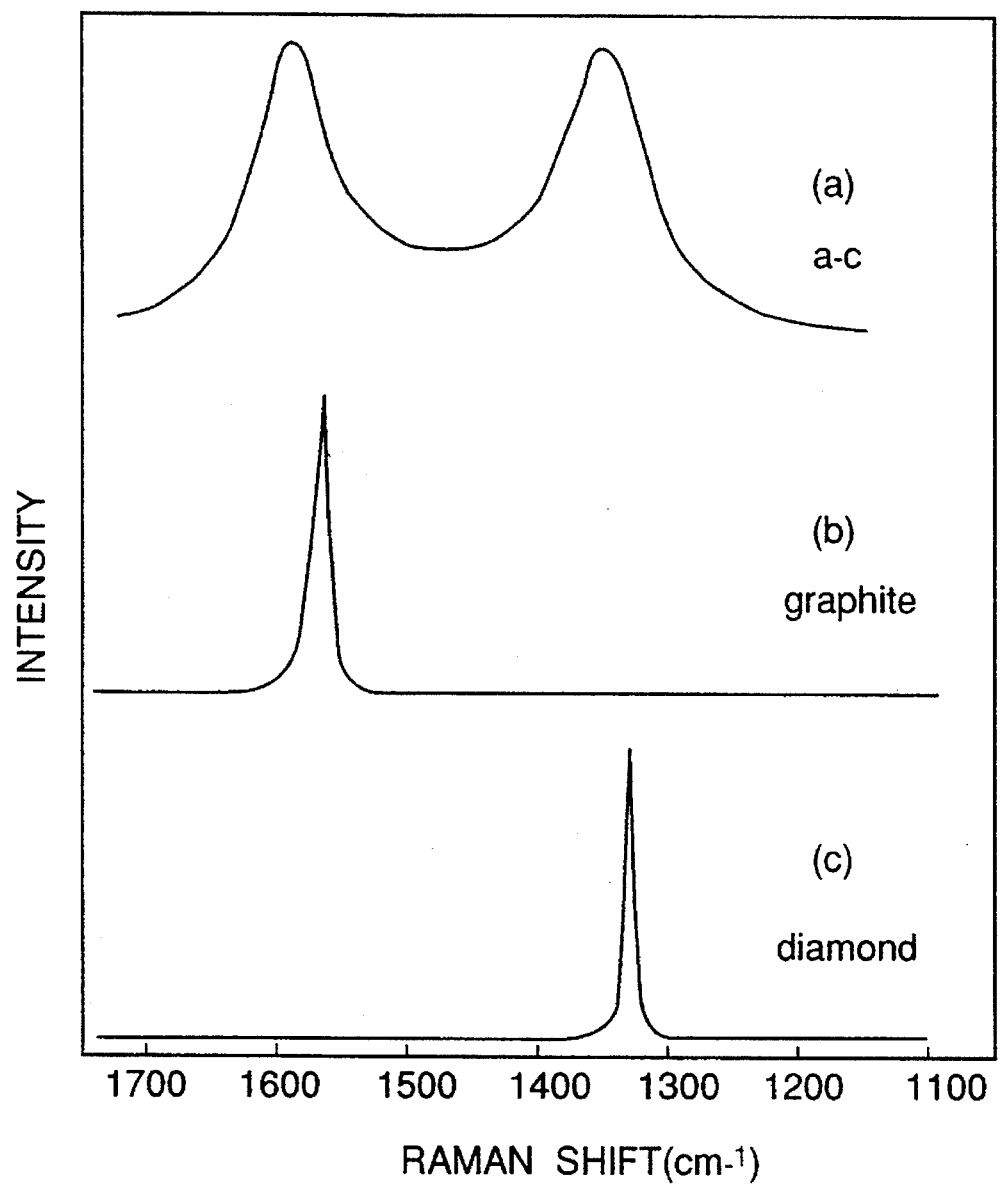
FIG. 3 is a graph showing typical Raman spectra of amorphous carbon (diamond-like carbon) film (curve A), graphite (curve B), and diamond (curve C).

(2) The crystalline state of diamond-like carbon is amorphous. The diamond-like carbon can be discriminated from diamond or graphite, e.g., by use of Raman spectroscopy. FIG. 3 shows typical spectra of diamond-like carbon or amorphous carbon (curve A), graphite (curve B), and diamond (curve C). As shown in FIG. 3, the Raman spectrum of diamond (curve C) has a sharp peak at 1,332 $cm^{-1}$ (based on $sp^3$ C—C bond), and the Raman spectrum of graphite (curve B) has a sharp peak at 1,580 $cm^{-1}$ (based on $sp^2$ C—C bond). On the other hand, the Raman spectrum of diamond-like carbon (curve A) has broad peaks at 1,360 $cm^{-1}$ and 1,600 $cm^{-1}$.

(3) The diamond-like carbon has a higher hardness than those of general metals. More specifically, the diamond-like carbon to be used in the present invention may preferably has a Vickers hardness Hv of about 1,000 to 5,000, while diamond generally has a Vickers hardness Hv of about 10,000.

(4) The diamond-like carbon is an electrically insulating substance.

A diamond-like carbon film having the above properties may be formed by a vapor-phase process such as plasma CVD, ion beam deposition, or sputtering similarly as in the synthesis of diamond. More specifically, the diamond-like carbon can be obtained by decreasing the temperature of a substrate on which the diamond-like carbon is to be deposited (e.g., a temperature of the substrate of about 100° C.) under the CVD conditions which are the same as those for diamond formation (with respect to further details of diamond-like carbon, e.g., a paper entitled "Diamond-Like Carbon Thin Films", written by Akio Hiraki and Hiroshi Kawarada, "TANSO (Carbon)", 1987 (No. 128), pp. 41–49 (published by Nihon Tanso Gakkai) may be referred to).

Hereinbelow, the present invention will be described in more detail with reference to specific Examples.

EXAMPLE 1

Figure 2:
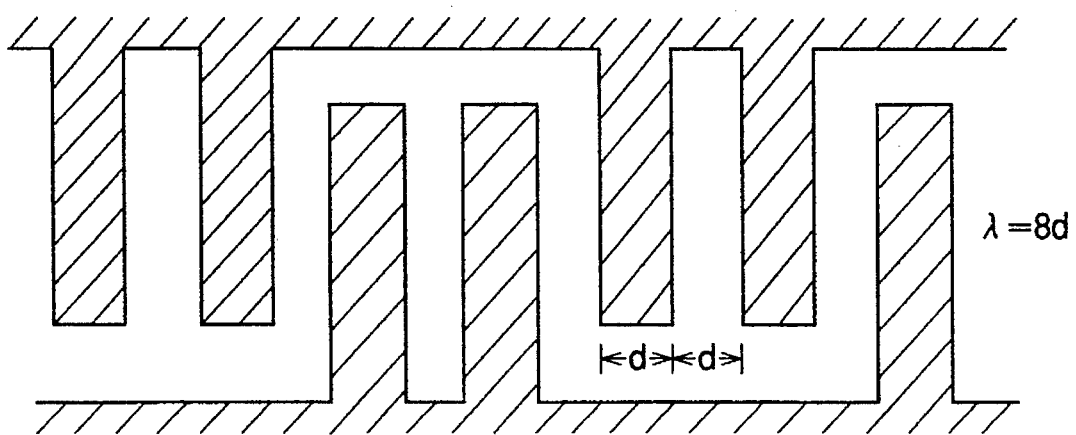
FIG. 2 is a schematic plan view showing another example (double-type electrode) of the planar shape of an IDT constituting a SAW device.
Figure 4:
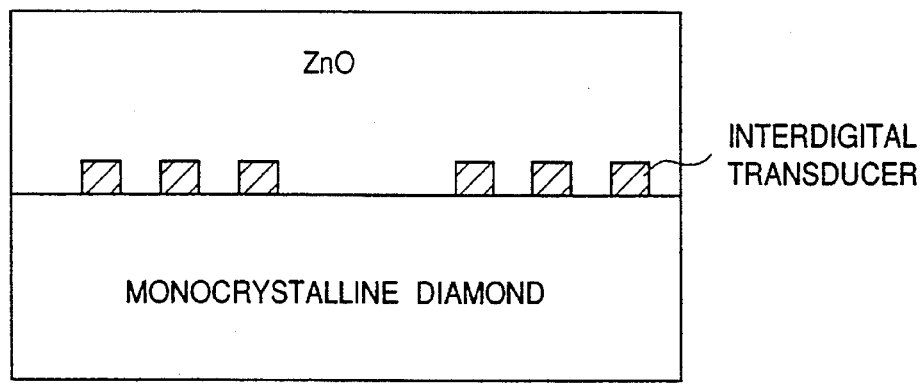
FIG. 4 is a schematic sectional view showing a SAW device having a layer structure wherein an IDT is formed on a surface of a monocrystalline diamond substrate having a (111) orientational property, and thereafter a ZnO film is formed on the IDT.
Figure 5:
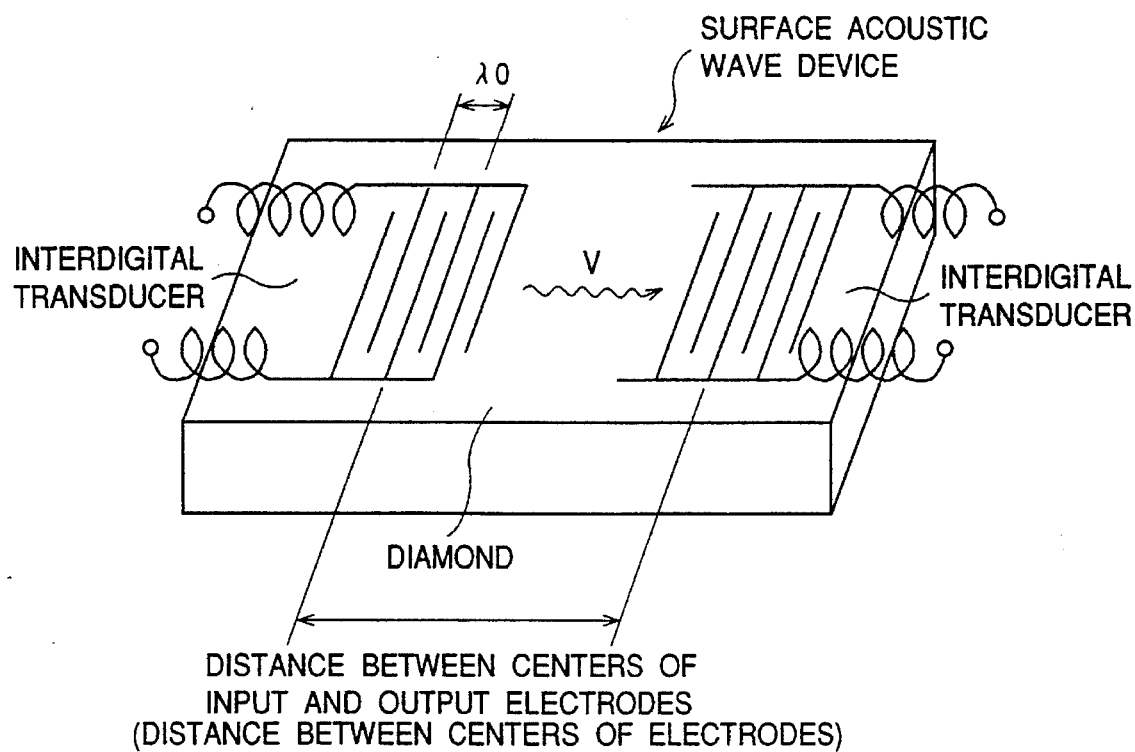
FIG. 5 is a schematic perspective view showing an example of a relationship among a wavelength λ, an IDT, and a distance between the centers of input and output electrodes in a SAW device.

An IDT of Al (thickness: 400 Å; planar shape: double-type electrode as shown in FIG. 2) was formed on each of Ia-type natural diamond substrates respectively having (100), (110) and (111) plane orientations, and Ib-type high pressure-synthesized diamond substrates respectively having (100), (110) and (111) plane orientations. A ZnO film (thickness: $1\times10^4$ Å) was then formed on each of the thus formed IDTs by using RF (radio frequency) magnetron sputtering, thereby to provide SAW devices each having a structure as shown in a schematic sectional view of FIG. 4.

<RF Magnetron Sputtering Conditions>

Pressure: 0.01 Torr

Substrate Temperature: 250° C.

Ar: $O_2$=50:50

RF power: 200 W

Film Thickness: 1 μm

Target: ZnO sintered product

The c-axis orientational property of each of the ZnO films formed in the above-described manner was examined by using an X-ray diffraction apparatus. The standard deviation σ value of the rocking curve in the (001) direction was used as an valuation criterion for the film quality of the ZnO film (a smaller σ value indicates a higher orientational property). No orientational property other than the c-axis orientation was observed in any of the thus evaluated ZnO films.

SAW devices including three species of IDTs respectively having different distances between input and output electrodes were formed in the same manner as described above except for changing the distances between input and output electrodes in the IDTs. With respect to each of the thus prepared SAW devices, propagation loss was evaluated by measuring the operating characteristics of the device by means of a commercially available network analyzer (trade name: 8719A, available from Yokogawa-Hewlett-Packard (YHP) K.K.). At this time, an insertion loss (IL) of propagation characteristic S21 as a measurement parameter was calculated, and conversion losses (TL1) and (TL2) as other measurement parameters were calculated from reflection characteristics S11 and S12, and the following propagation loss PL (dB):

$$PL\ (dB) = IL - TL1 - TL2 - 6$$

was calculated by using a bidirectional loss of 6 (dB) which is inherently provided in such an electrode arrangement or structure.

The parameters of the electrodes used herein were as follows.

Electrode Element (teeth of comb-like shape): 40 pairs (double-type electrode, normal-type)

Electrode Element Width: 1.25 μm (Center Frequency: 1 GHz)

Electrode Element Intersection Width: 50× Wavelength (wavelength: electrode width×8)

Figure 6:
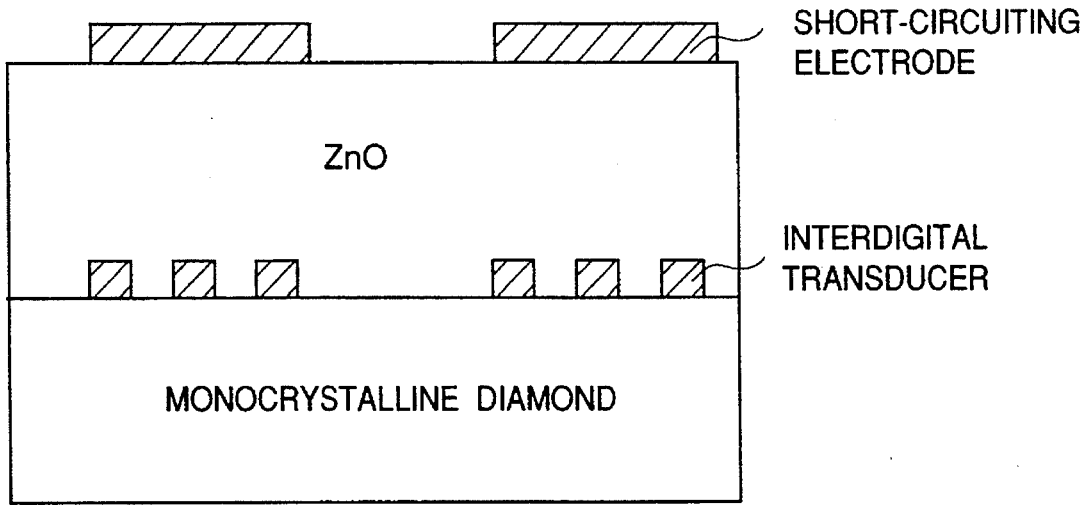
FIG. 6 is a schematic sectional view showing a SAW device having a layer structure wherein a short-circuiting electrode is further formed on the device shown in FIG. 4.

Distance between Centers of Input and Output Electrodes: 50× wavelength, 80× wavelength, 110 × wavelength After the propagation losses were evaluated in the above-mentioned manner, a short-circuiting electrode (thickness: 500 Å) was formed on each of the ZnO films by use of Al thereby to fabricate SAW devices each having a structure as shown in FIG. 6. With respect to the thus obtained SAW devices, the propagation losses thereof were measured in the same manner as described above.

The results of evaluation of the above propagation losses are summarized in the following Table 1.

TABLE 1

| <Substrate> | <Standard Deviation σ of ZnO Film> | <Propagation Loss [dB/cm]> | Propagation Loss After Al Electrode Formation |
|---|---|---|---|
| Natural Ia (100) Mono-crystalline | 1.62 to 1.71 | 89 | 91 |
| Natural Ia (110) Mono-crystalline | 1.74 to 1.93 | 92 | 94 |
| Natural Ia (111) Mono-crystalline | 0.81 to 0.92 | 65 | 67 |
| High-pressure Ib (100) Mono-crystalline | 1.38 to 1.54 | 84 | 88 |
| High-pressure Ib (110) Mono-crystalline | 1.22 to 1.39 | 82 | 86 |
| High-pressure Ib (111) Mono-crystalline | 0.23 to 0.38 | 62 | 64 |

EXAMPLE 2

A diamond thin film was epitaxially grown on each of natural Ia-type and high-pressure synthesized Ib-type monocrystalline diamond substrates respectively having (100), (110) and (111) orientations, and on an Si (100) surface and a β-SiC (111) surface. A ZnO film (thickness: 10,000 Å) was then formed on each of the resultant diamond films. At this time, the conditions for the formation of the ZnO films were the same as those in Example 1.

Figure 7:
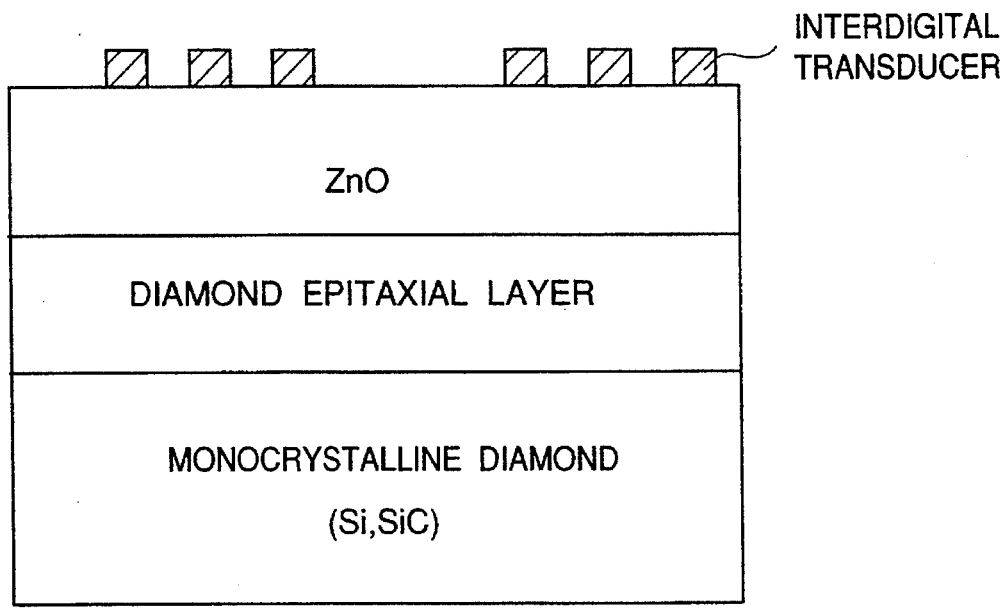
FIG. 7 is a schematic sectional view showing a SAW device having a layer structure wherein a diamond epitaxial layer is formed on a surface of a monocrystalline diamond (or Si, SiC) substrate having a (111) orientational property, a ZnO film is then formed on the diamond epitaxial layer, and an IDT is formed on the ZnO film.

Then an IDT (thickness: 500 Å) was formed on each of the above ZnO films, thereby to provide SAW devices each having a structure as shown in FIG. 7. The propagation losses of the thus obtained SAW devices were measured in the same manner as described above.

Figure 8:
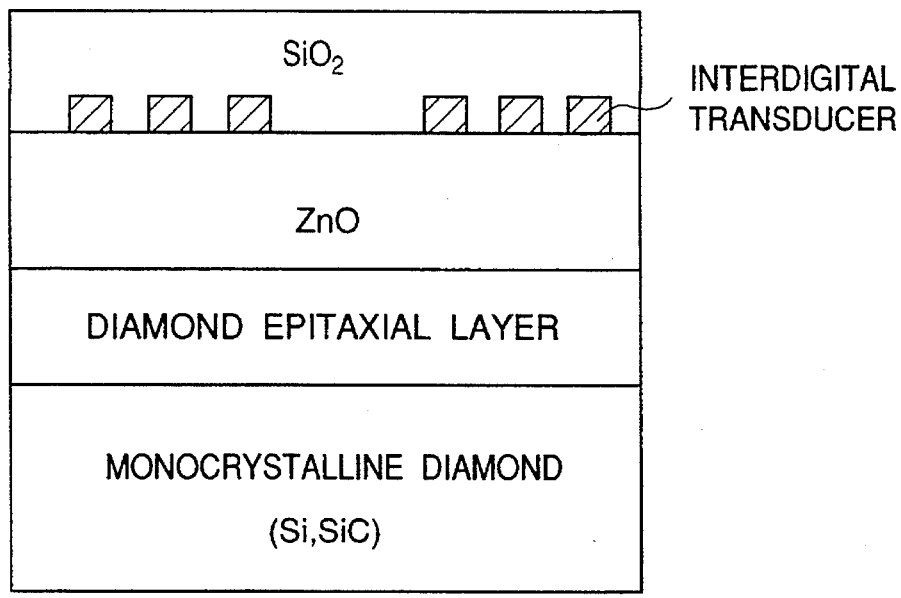
FIG. 8 is a schematic sectional view showing a SAW device having a layer structure wherein an $SiO_2$ film is further formed on the device shown in FIG. 7.

In addition, after the above-mentioned propagation losses were measured, an $SiO_2$ film (thickness: 300 Å) was formed on each of the above SAW devices, thereby to provide SAW devices each having a structure as shown in FIG. 8. The propagation losses of the thus obtained SAW devices were measured in the same manner as described above. At this time, the temperature coefficient of each of these devices was also measured before and after the formation of the $SiO_2$ film. The results of such measurement were as follows.

| | <Temperature Coefficient> |
|---|---|
| Before $SiO_2$ Formation | −40 to −50 (ppm/°C.) |
| After $SiO_2$ Formation | −10 to 10 (ppm/°C.) |

Figure 9:
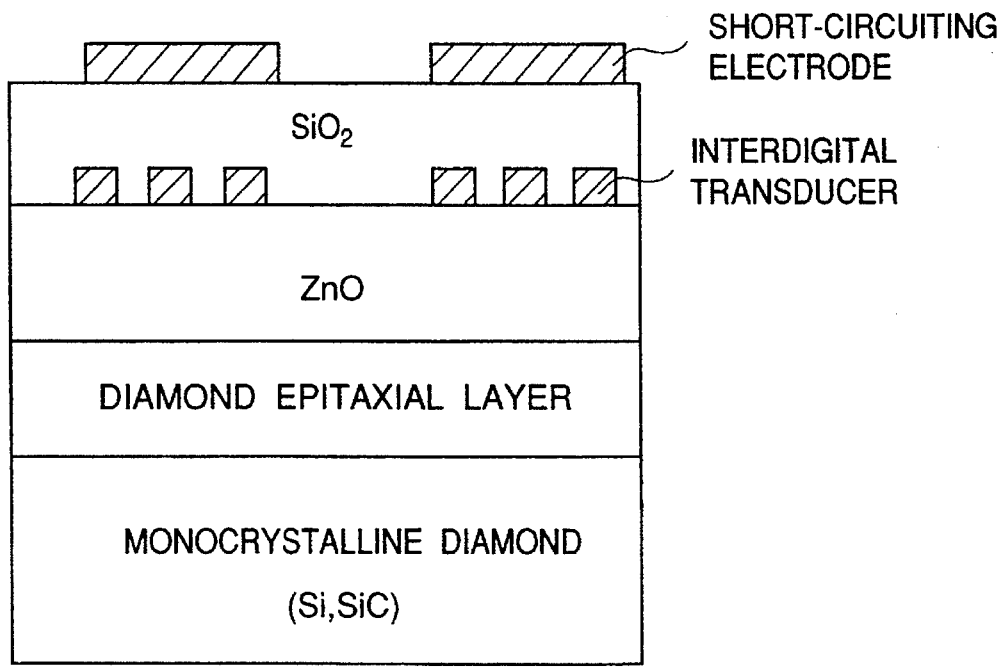
FIG. 9 is a schematic sectional view showing a SAW device having a layer structure wherein a short-circuiting electrode is further formed on the device shown in FIG. 8.

In addition, after the propagation losses were measured in the above-mentioned manner, a short-circuiting electrode (thickness: 500 Å) was formed on each of the SAW devices by use of Al thereby to provide SAW devices each having a structure as shown in FIG. 9. The propagation losses of these SAW devices were measured in the same manner as described above.

<Conditions for Formation of Diamond Epitaxial Films>

Microwave Plasma CVD

On (100) and (110) surfaces;

Power: 300 W

Pressure: 30 to 40 Torr

CH$_4$/ H$_2$=1 to 6% (in terms of flow rate, the same in the description appearing hereinbelow)

On (111) surface;

CH$_4$/H$_2$=1 to 2% (the other conditions were the same as described above)

<Conditions for Hetero-Epitaxial Growth on Si and SiC>

Microwave Plasma CVD

Microwave Power: 900 W

Pressure: 10 to 3 mTorr

CH$_4$/H$_2$=5/99.5

Substrate Temperature: 800° C.

(A DC bias of −150 V was applied to the substrate side.)

<Evaluation of Propagation Loss>

The propagation losses were evaluated under the same conditions as those employed in Example 1.

<Conditions for SiO$_2$ Formation>

RF Magnetron Sputtering

Ar: O$_2$=1:1 (Pressure: 0.02 Torr)

RF power: 200 W

SiO$_2$ Target

Film Thickness: 0.3 μm

The results of evaluation of the above propagation losses are summarized in the following Table 2.

TABLE 2

| <Plane Orientation of Diamond Thin Film> | <Standard Deviation σ of ZnO Film> | <Propagation Loss [dB/cm]> | <Propagation Loss After SiO$_2$ Formation> | <Propagation Loss After Short-Circuiting Electrode Formation> |
|---|---|---|---|---|
| (100)/Natural Ia (100) | 1.78 to 1.96 | 94 | 99 | 100 |
| (110)/Natural Ia (110) | 1.71 to 1.94 | 87 | 91 | 93 |
| (111)/Natural Ia (111) | 0.89 to 1.00 | 65 | 69 | 70 |
| (100)/High-Pressure Ib (100) | 1.56 to 1.73 | 81 | 86 | 88 |
| (110)/High-Pressure Ib (110) | 1.48 to 1.57 | 72 | 78 | 80 |
| (111)/High-Pressure Ib (111) | 0.50 to 0.55 | 63 | 67 | 69 |
| (100)/Si (100) | 2.1 | 100 | 108 | 111 |
| (111)/β-SiC (111) | 1.3 | 69 | 71 | 73 |

EXAMPLE 3

A (100) monocrystalline Si substrate was loaded into a hot filament-type CVD apparatus, and the apparatus was evacuated to 10$^{-6}$ Torr or below. Then, CH$_4$ and H$_2$ gases (CH$_4$/H$_2$=1 to 8%) were supplied to a reaction chamber of the apparatus. The pressure of the reaction chamber was set to 100 to 200 Torr, the filament temperature was set to 2,100° C., and the distance between the filament and the substrate was adjusted so as to provide a temperature of the substrate surface of 950° C., thereby to form a diamond film.

Each of the diamond films obtained in the above manner was evaluated by using an X-ray diffraction apparatus and was found to be a polycrystalline diamond film wherein plane orientations of (100), (110) and (111) were observed. When the gas composition ratio and the pressure in the reaction chamber were simultaneously changed, the intensity ratio of a (111) or (220) plane of the above diamond film was changed, thereby to form seven species of polycrystalline diamond films. Since different peak intensities were observed on the respective planes in X-ray diffraction, the peak intensity of a (111) plane was denoted by 100 to normalize the peak intensities of the other planes.

Figure 10:
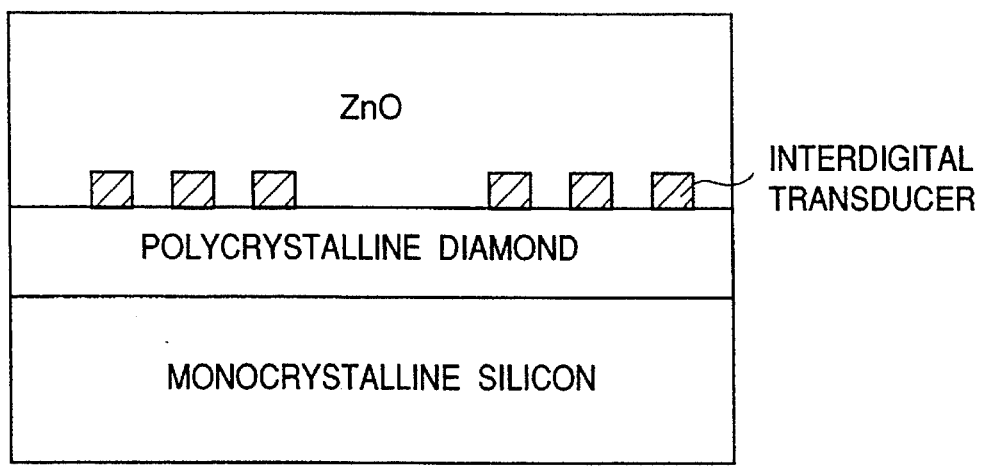
FIG. 10 is a schematic sectional view showing a SAW device having a layer structure wherein a polycrystalline diamond layer is formed on a monocrystalline silicon substrate, an IDT is formed on a surface of the polycrystalline diamond layer having a (111) orientational property, and a ZnO film is further formed on the IDT.

The resultant diamond substrates were polished, and an IDT (thickness: 500 Å) and a ZnO film (thickness: 10,000 Å) were formed on each of the substrates in this order, thereby to provide SAW devices having a structure as shown in FIG. 10. At this time, the ZnO films were formed under the following conditions.

DC Planar Magnetron Sputtering

Target: Zn

O$_2$ Gas

Pressure: 0.2 Torr

Substrate Temperature: 300° C.

IDTs having different electrode intervals between the electrode elements constituting the IDTs were formed as the above-mentioned IDTs, and the propagation losses of the resultant SAW devices were evaluated in the same manner as in Example 1.

The results of evaluation of the above propagation losses are summarized in the following Table 3.

TABLE 3

| | <X-Ray Diffraction Intensity> | | | <σ Value of ZnO Film> | <Propagation Loss [dB/cm]> |
|---|---|---|---|---|---|
| | (111) | (220) | (400) | | |
| No. 1 | 100 | 25 | 8 | 1.83 to 2.10 | 94 |
| No. 2 | 100 | 20 | 5 | 1.35 to 1.52 | 91 |
| No. 3 | 100 | 15 | 5 | 1.14 to 1.21 | 88 |
| No. 4 | 100 | 10 | 3 | 1.01 to 1.11 | 75 |
| No. 5 | 100 | 4 | 1 | 0.82 to 0.85 | 69 |
| No. 6 | 100 | 1 | 0 | 0.78 to 0.80 | 67 |
| No. 7 | 100 | 160 | 3 | 1.63 to 1.77 | 86 |

EXAMPLE 4

Diamond thin films were formed under the same conditions as those employed in Example 3. The surfaces of the resultant diamond films were polished, and thereafter an IDT (thickness: 500 Å) was formed on each of the diamond films, and then a ZnO film (thickness: 10,000 Å) was formed on the IDT, thereby to provide SAW devices each having a structure as shown in FIG. 10.

The above ZnO films were formed under the following conditions.

RF Planar Magnetron Sputtering

Target: ZnO

Ar +O$_2$ Gas (1:1)

Pressure: 0.02 Torr

Substrate Temperature: 300° C.

After the ZnO films were formed, the propagation losses of the resultant SAW devices were measured in the same manner as in Example 1.

Figure 11:
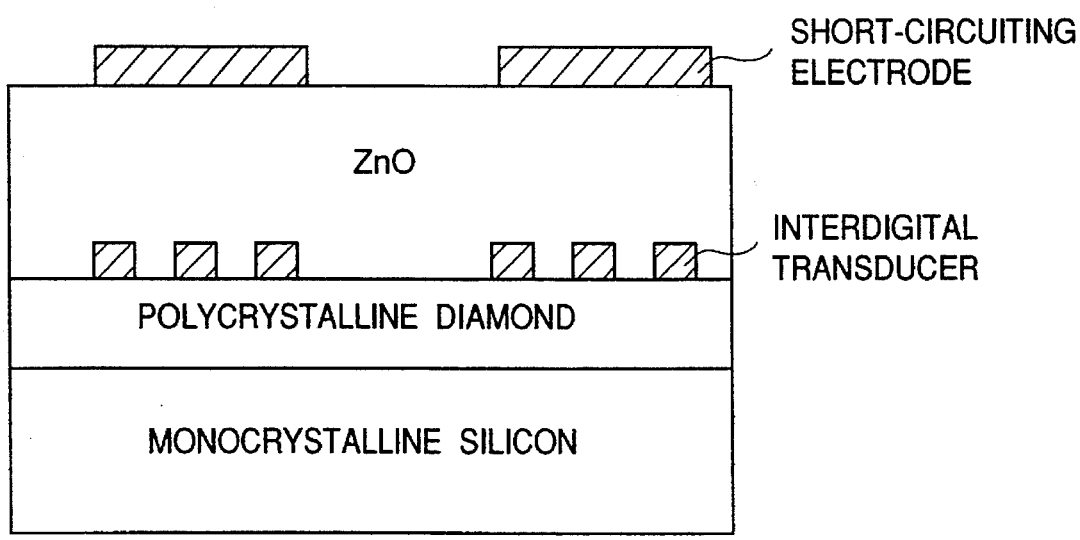
FIG. 11 is a schematic sectional view showing a SAW device having a layer structure wherein a short-circuiting electrode is further formed on the device shown in FIG. 10.

After the propagation losses were measured, a short-circuiting electrode (thickness: 500 Å) was formed on each of the ZnO films by use of Al, thereby to provide SAW devices each having a structure as shown in FIG. 11. The propagation losses of the resultant SAW devices were measured.

Figure 12:
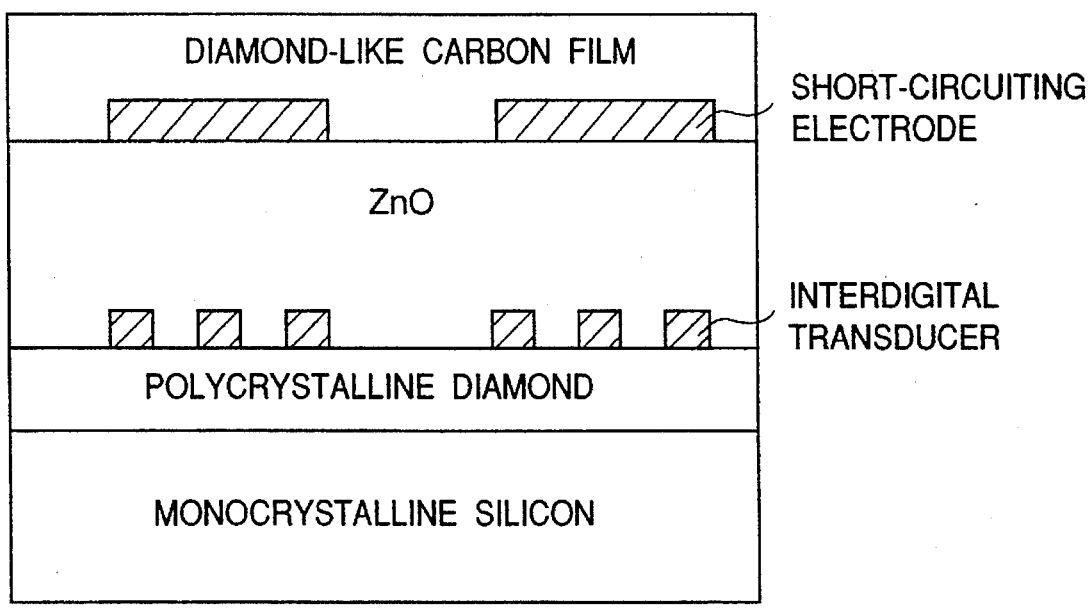
FIG. 12 is a schematic sectional view showing a SAW device having a layer structure wherein a diamond-like carbon film is further formed on the device shown in FIG. 11.

After the propagation losses were measured, a diamond-like carbon film (thickness: 400 Å) was formed on each of the surfaces of the SAW devices shown in FIG. 11 by using a plasma CVD method, thereby to provide SAW devices each having a structure as shown in FIG. 12. The propagation losses of the resultant SAW devices were measured.

The above diamond-like carbon film was formed in a manner such that a methane gas was supplied to the reaction chamber at about 5 sccm, the pressure in the reaction chamber was maintained at about 0.002 Torr, the substrate temperature was set to 25° C., and discharge was conducted at a power density of 2 W/cm$^2$ to provide a plasma state for about 0.5 hours, thereby to form the 400-Å thick film.

With respect to each of the thus obtained SAW devices, the electromechanical coupling coefficient was evaluated before and after the formation of the diamond-like carbon film by using a network analyzer.

The results of the evaluation are as follows.

| <Electromechanical Coupling Coefficient> | |
| --- | --- |
| Before Formation of Diamond-Like Carbon Film | 1.5% |
| After Formation of Diamond-Like Carbon Film | 3.4% |

The results of evaluation of the above propagation losses are summarized in the following Tables 4A and 4B.

TABLE 4A

| | <X-Ray Diffraction Intensity> | | | σ Value |
| --- | --- | --- | --- | --- |
| | (111) | (220) | (400) | of ZnO Film |
| No. 1 | 100 | 25 | 8 | 2.10 |
| No. 2 | 100 | 20 | 5 | 1.71 |
| No. 3 | 100 | 15 | 5 | 1.21 |
| No. 4 | 100 | 10 | 3 | 1.09 |
| No. 5 | 100 | 4 | 1 | 0.83 |
| No. 6 | 100 | 1 | 0 | 0.76 |
| No. 7 | 100 | 160 | 3 | 1.68 |

TABLE 4B

| | <Propagation Loss After Short-Circuiting Electrode Formation [dB/cm]> | <Propagation Loss After Diamond-Like Carbon Film Formation> |
| --- | --- | --- |
| No. 1 | 95 | 103 |
| No. 2 | 92 | 99 |
| No. 3 | 90 | 96 |
| No. 4 | 77 | 82 |
| No. 5 | 70 | 74 |
| No. 6 | 67 | 70 |
| No. 7 | 88 | 96 |

EXAMPLE 5

A film of Al (thickness: 500 Å) was formed on each of Ia-type natural diamonds and Ib-type high-pressure synthesized diamonds respectively having (100), (110) and (111) plane orientations, and an Al negative (or reversed) pattern for IDT was formed by photolithography with respect to each of the diamonds, thereby to form Al patterns to be used as masks.

Figure 13:
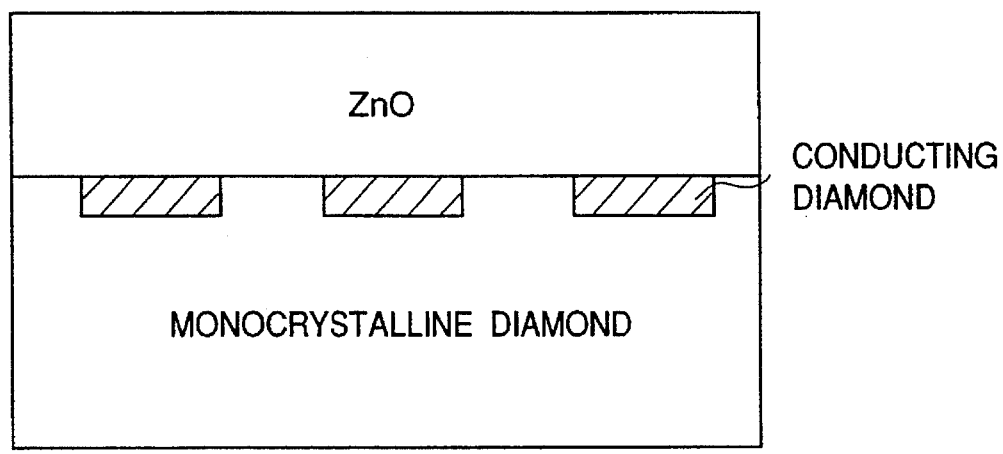
FIG. 13 is a schematic sectional view showing a SAW device having a layer structure wherein an IDT (embedded type) comprising conductive diamond is formed on a surface of a monocrystalline diamond substrate having a (111) orientational property, and a ZnO film is further formed on the IDT.

Each of these substrates was loaded in an ion implantation apparatus, and B (boron) ions were implanted thereinto. At this time, B ions were implanted at an acceleration voltage of 120 kev and a dose of $4.5 \times 10^{20}$ cm$^{-2}$. After the ion implantation, the mask was removed, and the resultant substrate was annealed so that the resultant semiconductive diamond portion provided by the B ion implantation might constitute an IDT. In addition, ZnO film (thickness: about $1 \times 10^4$ Å) was formed on each of the resultant IDTs by using RF magnetron sputtering, thereby to provide SAW devices each having a structure as shown in FIG. 13. The propagation losses of the thus obtained SAW devices was measured in the same manner as in Example 1.

<RF Magnetron Sputtering Conditions>

Pressure: 0.01 Torr

Substrate Temperature: 250° C.

Ar: O$_2$=50:50

RF power: 200 W

Film Thickness: about 1 μm

Target: ZnO sintered product

Figure 14:
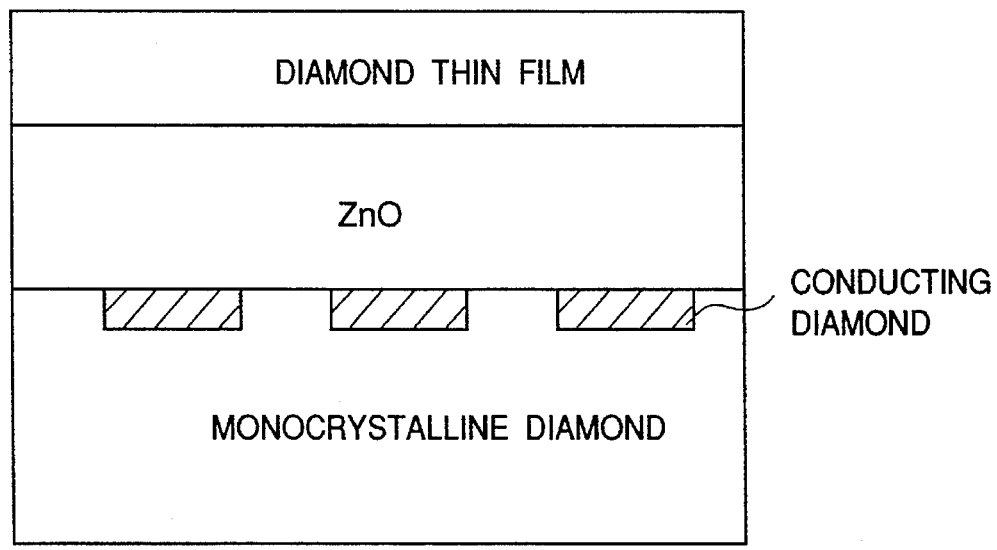
FIG. 14 is a schematic sectional view showing a SAW device having a layer structure wherein a diamond thin film is further formed on the device shown in FIG. 13.

After the measurements of the propagation losses, a diamond thin film (thickness: 3,000 Å) was formed on each of the SAW devices shown in FIG. 13, thereby to provide SAW devices each having a structure as shown in FIG. 14. The propagation losses of the thus obtained SAW devices was evaluated in the same manner as in Example 1.

<Conditions for Diamond Thin Film Formation>

Apparatus: Microwave Plasma CVD Apparatus

Microwave Power: 350 W

Reaction Gas CH$_4$: O$_2$:H$_2$=0.5:1:98.5

Reaction Pressure: 30 Torr

Film Formation Temperature: 500° C.

Film Thickness: 0.3 μm

The results of evaluation of the above propagation losses are summarized in the following Table 5.

TABLE 5

| Substrate | Standard Deviation σ of ZnO Film | Propagation Loss [dB/cm] | Propagation Loss After Diamond Thin Film Formation |
| --- | --- | --- | --- |
| Natural Ia (100) Monocrystalline | 1.81 | 96 | 107 |
| Natural Ia (110) Monocrystalline | 1.97 | 99 | 108 |
| Natural Ia (111) Monocrystalline | 0.96 | 73 | 80 |
| High-Pressure Ib (100) Monocrystalline | 1.58 | 86 | 101 |
| High-Pressure Ib (110) Monocrystalline | 1.44 | 83 | 98 |
| High-Pressure Ib (111) Monocrystalline | 0.43 | 67 | 73 |

EXAMPLE 6

Ib-type high-pressure synthesized monocrystalline diamonds respectively having (100), (110) and (111) plane orientations were provided, and an Al film (thickness: 500

Å) for forming a mask for diamond etching was vapor-deposited on each surface of the diamonds. Resist was applied onto the Al film, and a reversed pattern for IDT was formed by using photolithography. Thereafter, the patterned Al film was removed by etching by use of an aqueous 5% sodium hydroxide solution (another alkaline solution could also be used), and then the resist film used in the above photolithography was removed, thereby to fabricate a reversed pattern for IDT.

Each of the resultant product was loaded in an RIE (Reactive Ion Etching) apparatus, and the diamond surface of each product was etched, thereby to provide a groove corresponding to an IDT configuration. At this time, the etching depth was 500 Å.

<RIE Conditions>

Ar : $O_2$=90:10

RF Power: 200 W

Pressure: 0.01 Torr

After the RIE treatment, the Al film was removed, and a reversed pattern of resist corresponding to IDT was formed at the position at which the above-mentioned Al mask had been placed. Subsequently, an Al film (500 Å) was vapor-deposited on the resultant product, and then the resist film was removed, thereby to form an embedded-type electrode (lift-off method).

Figure 15:
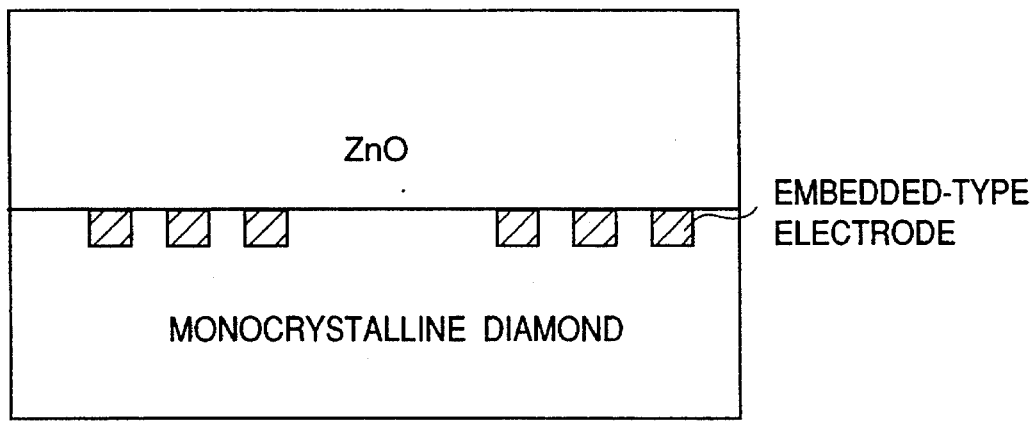
FIG. 15 is a schematic sectional view showing a SAW device having a layer structure wherein an IDT (embedded type) comprising Al (aluminum) is formed on a surface of monocrystalline diamond having a (111) orientational property, and a ZnO film is further formed on the IDT.

By using the resultant product as a substrate, a ZnO film (thickness: 10,000 Å) was formed on the substrate, thereby to provide SAW devices each having a structure as shown in FIG. 15. The propagation losses of the thus obtained SAW devices were measured.

Figure 16:
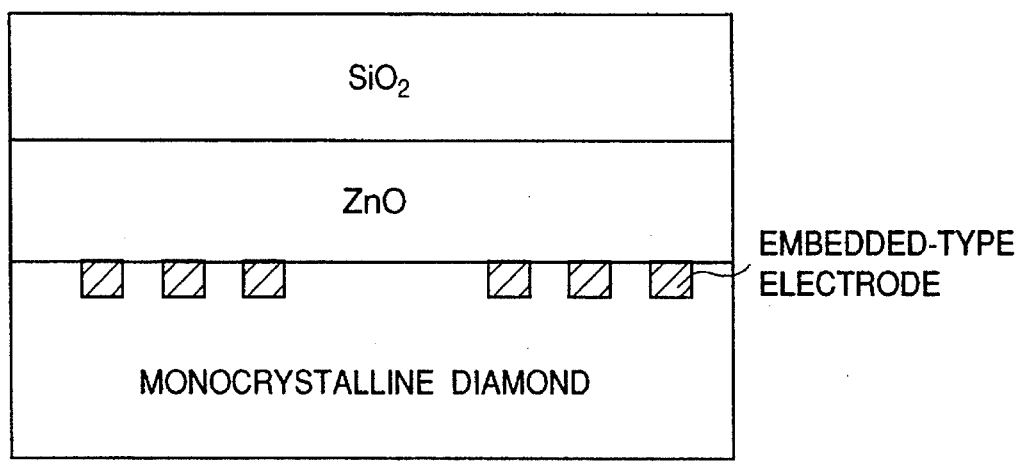
FIG. 16 is a schematic sectional view showing a SAW device having a layer structure wherein an $SiO_2$ film is further formed on the device shown in FIG. 15.

After the measurement of the propagation losses, an $SiO_2$ film (thickness: 3,000 Å) was formed on the ZnO film, thereby to provide SAW devices each having a structure as shown in FIG. 16. The propagation losses of the thus obtained SAW devices were measured.

Figure 17:
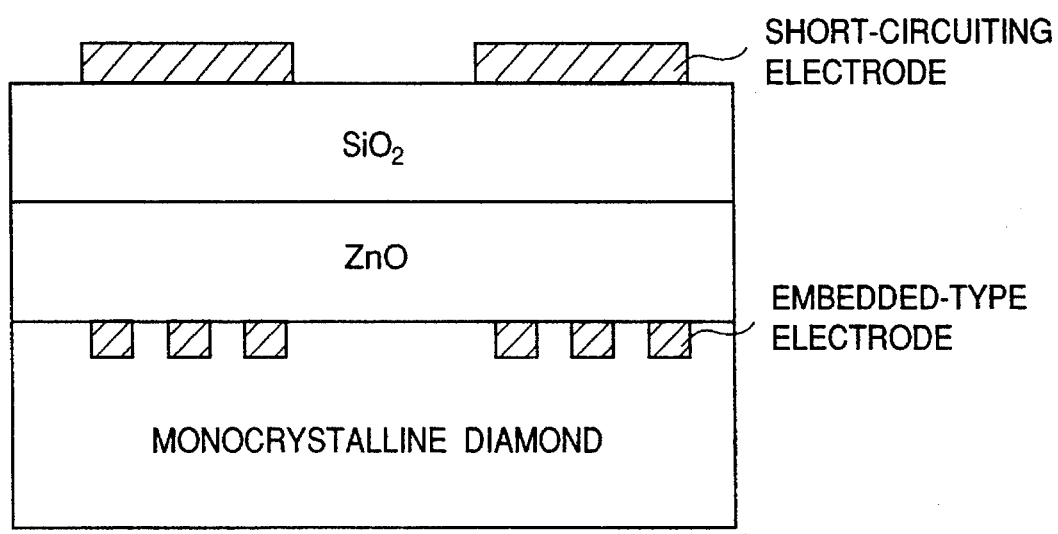
FIG. 17 is a schematic sectional view showing a SAW device having a layer structure wherein a short-circuiting electrode is further formed on the device shown in FIG. 16.

After the measurement of the propagation losses, an Al short-circuiting electrode (thickness: 500 Å) was formed on the $SiO_2$ film by using ion plating, thereby to provide SAW devices each having a structure as shown in FIG. 17. The propagation losses of the thus obtained SAW devices were measured.

The above-mentioned ZnO and $SiO_2$ film were formed under the following conditions.

<ZnO Film>

RF Magnetron Sputtering

Gas: Ar: $O_2$ (40:60)

Pressure: 0.01 Torr

RF Power: 200 W

Substrate Temperature: 250° C.

Target: ZnO sintered product

<$SiO_2$ Film>

RF Magnetron Sputtering

Gas: Ar: $O_2$ (1:1)

Pressure: 0.01 Torr

RF Power: 250 W

Target: $SiO_2$

Film Thickness: 0.3 μm

The results of evaluation of the above propagation losses are summarized in the following Table 6.

TABLE 6

| Substrate | σ of ZnO Film | Propagation Loss | Propagation Loss After $SiO_2$ Formation | Propagation Loss After Short-Circuiting Electrode Formation |
|---|---|---|---|---|
| Ib (100) | 1.8 | 83 | 89 | 92 |
| Ib (110) | 1.6 | 81 | 88 | 90 |
| Ib (111) | 0.6 | 63 | 69 | 72 |

EXAMPLE 7

A 1,000 Å-thick Al electrode was formed on each of high-pressure synthesized monocrystalline diamonds respectively having (100), (110) and (111) plane orientations, and an IDT (normal or addition-type) having the same electrode pattern as that used in Example 1 was formed. A ZnO thin film (thickness: 7,000 Å) was formed on the IDT, thereby to provide SAW devices. The above ZnO thin film was formed under the following conditions.

RF Magnetron Sputtering

Gas: Ar: $O_2$ (1:1)

Pressure: 0.01 Torr

Substrate Temperature: 300° C.

Film Thickness: 0.7 μm

In addition, for the purpose of comparison, a 1,000 Å-thick embedded-type IDT was formed on each of high-pressure synthesized monocrystalline diamonds respectively having (100), (110) and (111) plane orientations in the same manner as in Example 6. Thereafter, a ZnO film (thickness: 7,000 Å) was formed on the IDT, thereby to provide SAW devices. The propagation losses of the thus obtained SAW devices were measured. The results of measurement were as follows.

| <Substrate> | <Electrode Type> | <Propagation Loss (dB/cm)> |
|---|---|---|
| (100) | Addition-type | 91 |
| (110) | Addition-type | 89 |
| (111) | Addition-type | 78 |
| (100) | Embedded-type | 90 |
| (110) | Embedded-type | 84 |
| (111) | Embedded-type | 69 |

EXAMPLE 8

A (100) polycrystalline Si substrate was loaded in a plasma CVD apparatus, and the apparatus was evacuated to $10^{-6}$ Torr or below. Then, $CH_4$ and $H_2$ gases ($CH_4/H_2$-1 to 8%) were supplied to a reaction chamber of the plasma CVD apparatus, thereby to form a diamond film on the Si substrate. At this time, the pressure of the reaction chamber was set to 100 to 200 Torr, and the substrate temperature was set to 950° C. The thus obtained diamond film was evaluated by using an X-ray diffraction apparatus and was found to be a polycrystalline diamond film wherein plane orientations of (100), (110) and (111) were observed. When the gas composition ratio and the pressure in the reaction chamber were simultaneously changed, a plurality of polycrystalline diamond films could be formed while the intensity ratio of a (111) or (220) plane in the diamond film was changed. Since the respective planes of the polycrystalline diamond had different peak intensities in the X-ray diffraction, the peak intensity of a (111) plane was denoted by 100 to normalize the peak intensities of the other planes.

Two species of substrates were prepared under respective conditions as described above. The surface of each of the substrates was polished, and a short-circuiting electrode (thickness: 500 Å) was formed on the resultant substrate. Then, a ZnO film (thickness: 10,000 Å) was formed on the short-circuiting electrode.

Figure 18:
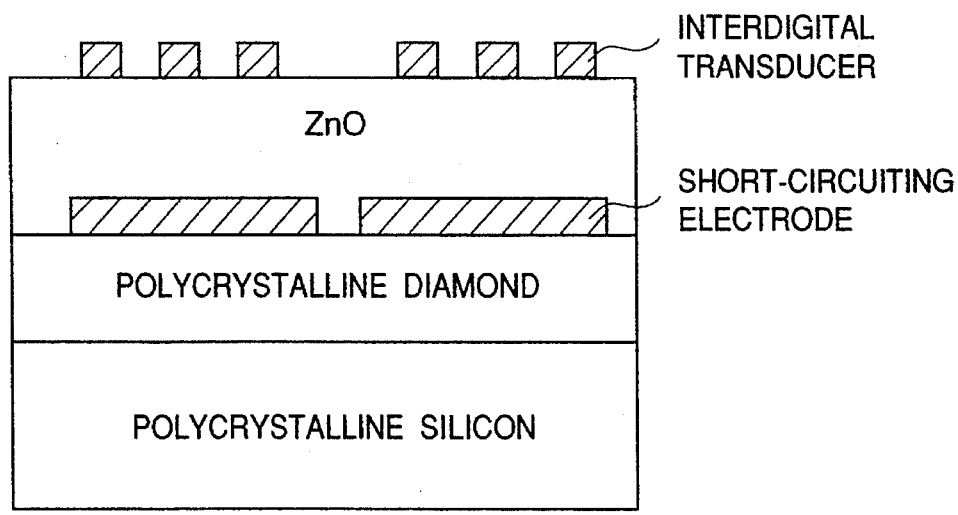
FIG. 18 is a schematic sectional view showing a SAW device having a layer structure wherein a polycrystalline diamond layer is formed on a polycrystalline silicon, a short-circuiting electrode is formed on a surface of the polycrystalline diamond layer having a (111) orientational property, a ZnO film is formed on the polycrystalline diamond layer, and an IDT is formed on the ZnO film.

An IDT was formed on the ZnO film of one of the two species of the substrates prepared above, thereby to provide a SAW device having a structure as shown in FIG. 18. The propagation loss of the thus obtained SAW device was evaluated in the same manner as in Example 1.

The above ZnO film was formed under the following conditions.

DC Planar Magnetron Sputtering

Target: Zn $O_2$ Gas

Pressure: 0.2 Torr

Substrate Temperature: 300° C.

Figure 19:
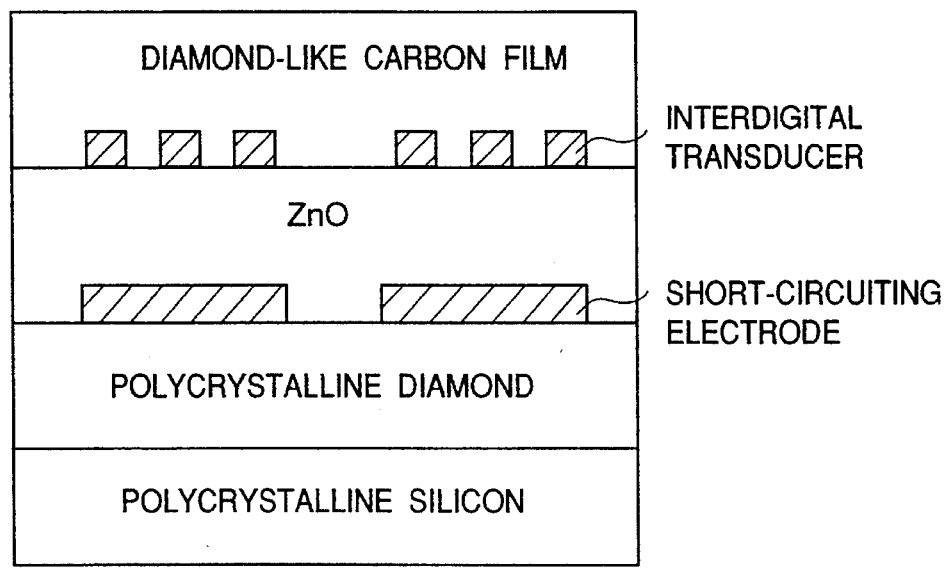
FIG. 19 is a schematic sectional view showing a SAW device having a layer structure wherein a diamond-like carbon film is further formed on the device shown in FIG. 18.

After the measurement of the propagation loss, a diamond-like carbon film (thickness: 400 Å) was formed on the above IDT, thereby to provide a SAW device having a structure as shown in FIG. 19. The propagation losses of the thus obtained SAW device were measured.

Figure 20:
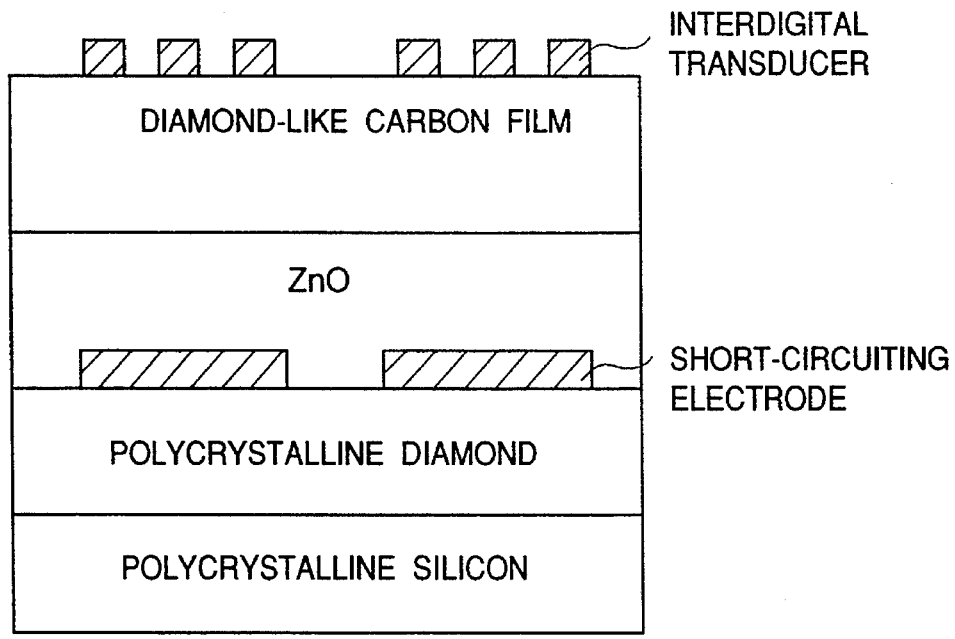
FIG. 20 is a schematic sectional view showing a SAW device having a layer structure wherein a polycrystalline diamond layer is formed on polycrystalline silicon, a short-circuiting electrode is formed on a surface of the polycrystalline diamond layer having a (111) orientational property, a ZnO film is formed on the polycrystalline diamond layer, a diamond-like carbon film is formed on the ZnO film, and an IDT is further formed on the diamond-like carbon film.

On the other hand, a diamond-like carbon film (thickness: 400 Å) was first formed on the above-mentioned ZnO film of the other of the two species of the substrates prepared above. An IDT (thickness: 500 Å) was formed on the resultant diamond-like carbon film, thereby to provide a SAW device having a structure as shown in FIG. 20. The propagation losses of these sample SAW devices obtained above were also measured. The conditions for the formation of the diamond-like carbon film were the same as those employed in Example 4.

The results of evaluation of the above propagation losses are summarized in the following Tables 7A and 7B.

TABLE 7A

| | <X-Ray Diffraction Intensity> | | | <σ Value of ZnO Film> |
|---|---|---|---|---|
| | (111) | (220) | (400) | |
| No. 1 | 100 | 25 | 8 | 2.34 |
| No. 2 | 100 | 25 | 8 | 2.41 |
| No. 3 | 100 | 19 | 6 | 1.64 |
| No. 4 | 100 | 17 | 6 | 1.59 |
| No. 5 | 100 | 11 | 3 | 1.28 |
| No. 6 | 100 | 13 | 2 | 1.34 |
| No. 7 | 100 | 1 | 0 | 0.85 |
| No. 8 | 100 | 1 | 0 | 0.88 |
| No. 9 | 100 | 181 | 4 | 1.77 |
| No. 10 | 100 | 172 | 5 | 1.82 |

TABLE 7B

| | <Propagation Loss [dB/cm]> | <Propagation Loss of Electrode/ Carbon Film> | <Propagation Loss of Carbon Film/ Electrode> |
|---|---|---|---|
| No. 1 | 95 | 103 | |
| No. 2 | 94 | | 101 |
| No. 3 | 92 | 98 | |
| No. 4 | 89 | | 98 |
| No. 5 | 71 | 80 | |
| No. 6 | 75 | | 83 |
| No. 7 | 68 | 73 | |
| No. 8 | 69 | | 75 |
| No. 9 | 87 | 95 | |
| No. 10 | 90 | | 99 |

EXAMPLE 9

A Diamond thin film (thickness: 10 μm, 1×10⁵ Å) was epitaxially grown on each of high-pressure synthesized Ib-type monocrystaline diamond substrates respectively having (100), (110) and (111) plane orientations. Each of the surfaces of the diamond films was polished and flattened, and a ZnO film (thickness: 10,000 Å) was formed on each of the diamond thin films, thereby to provide three substrates for each of the above-mentioned three types of plane orientations. The conditions for the epitaxial growth of the diamond film and the conditions for the formation of the ZnO film were the same as those in Example 2.

Figure 21:
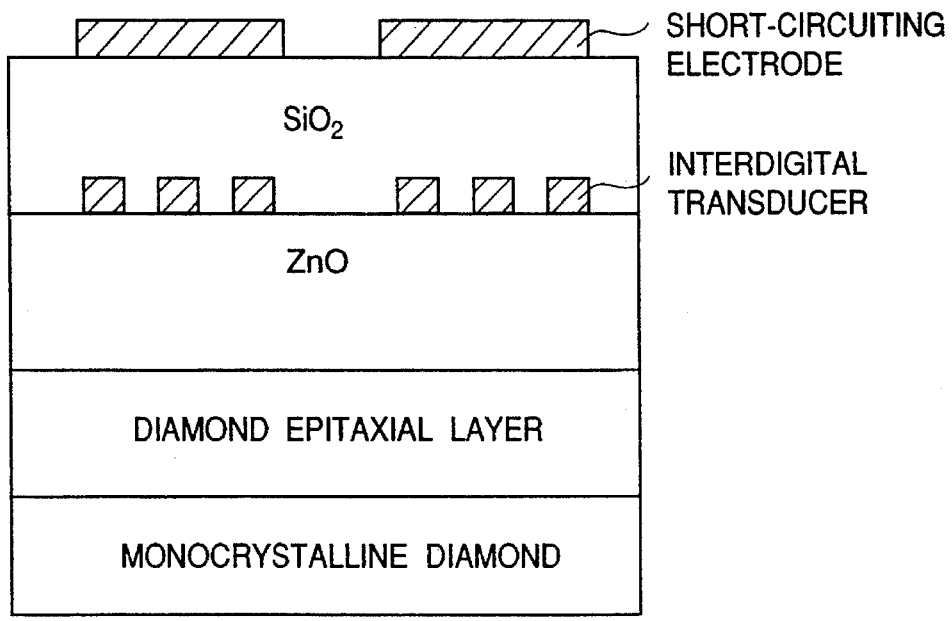
FIG. 21 is a schematic sectional view showing a SAW device having a layer structure wherein a diamond epitaxial layer is formed on monocrystalline diamond, a ZnO film is formed on a surface of the diamond epitaxial layer having a (111) orientational property, an IDT is formed on the ZnO film, an SiO$_2$ film is formed on the IDT, and a short-circuiting electrode is further formed on the SiO$_2$ film.

With respect to a first one of the above-mentioned three substrates, an IDT (thickness: 500 Å), an $SiO_2$ film (thickness: 3,000 Å), and a short-circuiting electrode (thickness: 500 Å) were formed on the above ZnO film in this order, thereby to provide a SAW device having a structure as shown in FIG. 21 for each of the three types of orientations.

Figure 22:
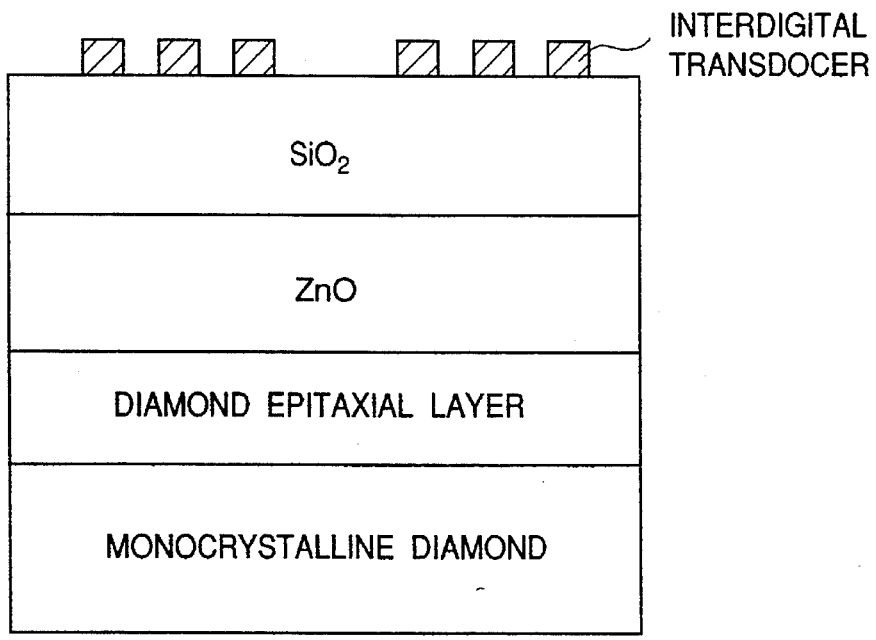
FIG. 22 is a schematic sectional view showing a SAW device having a layer structure wherein a diamond epitaxial layer is formed on monocrystalline diamond, a ZnO film is formed on a surface of the diamond epitaxial layer having a (111) orientational property, an SiO$_2$ film is formed on the ZnO film, and an IDT is further formed on the SiO$_2$ film.

With respect to a second one of the above-mentioned three substrates, an $SiO_2$ film and an IDT were formed on the above ZnO film in the same manner as described above except for forming the $SiO_2$ film IDT in this order, thereby to provide a SAW device having a structure as shown in FIG. 22 for each of the three types of orientations.

Figure 23:
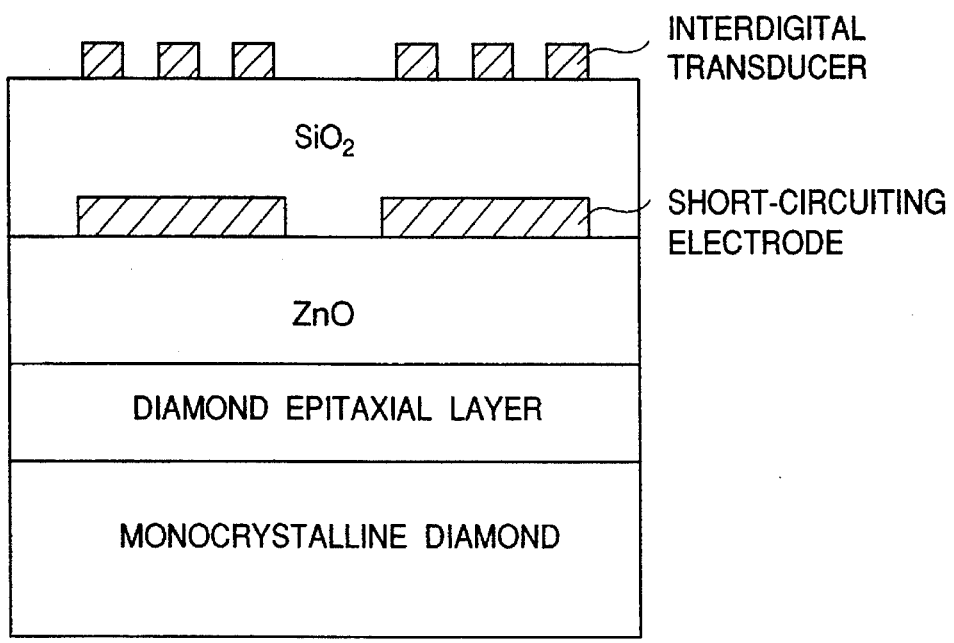
FIG. 23 is a schematic sectional view showing a SAW device having a layer structure wherein a diamond epitaxial layer is formed on monocrystalline diamond, a ZnO film is formed on a surface of the diamond epitaxial layer having a (111) orientational property, a short-circuiting electrode is formed on the diamond epitaxial layer, an SiO$_2$ film is formed on the short-circuiting electrode, and an IDT is further formed on the SiO$_2$ film.

With respect to the last one of the above-mentioned three substrates, a short-circuiting electrode, an $SiO_2$ film, and an IDT were formed on the above ZnO film in the same manner as described above except for forming the short-circuiting electrode, $SiO_2$ film, and IDT in this order, thereby to provide a SAW device having a structure as shown in FIG. 23 for each of the three types of orientations.

The propagation losses of the resultant nine species of SAW devices (samples), i.e.,(three types of substrates) x (three types of multilayer structures), were measured.

When the above SAW devices were formed, the conditions for the formation of the $SiO_2$ film was the same as those in Example 6. The propagation losses of the thus formed samples were measured in the same manner as in Example 1.

The results of evaluation of the above propagation losses are summarized in the following Tables 8A and 8B.

TABLE 8A

| Sample No. | Substrate | Propagation Loss of Short-Circuiting Electrode/SiO$_2$/Interdigital Transducer/Substrate |
|---|---|---|
| 1 | (100) | 87 |
| 2 | (100) | |
| 3 | (100) | |
| 4 | (110) | 81 |
| 5 | (110) | |
| 6 | (110) | |
| 7 | (111) | 70 |
| 8 | (111) | |
| 9 | (111) | |

TABLE 8B

| Sample No. | Propagation Loss of Interdigital Transducer/SiO$_2$/Substrate | Propagation Loss of Interdigital Transducer/SiO$_2$/Short-Circuiting Electrode/Substrate |
|---|---|---|
| 1 | | |
| 2 | 85 | |
| 3 | | 90 |
| 4 | | |
| 5 | 78 | |
| 6 | | 84 |
| 7 | | |
| 8 | 69 | |
| 9 | | 72 |

EXAMPLE 10

Figure 24:
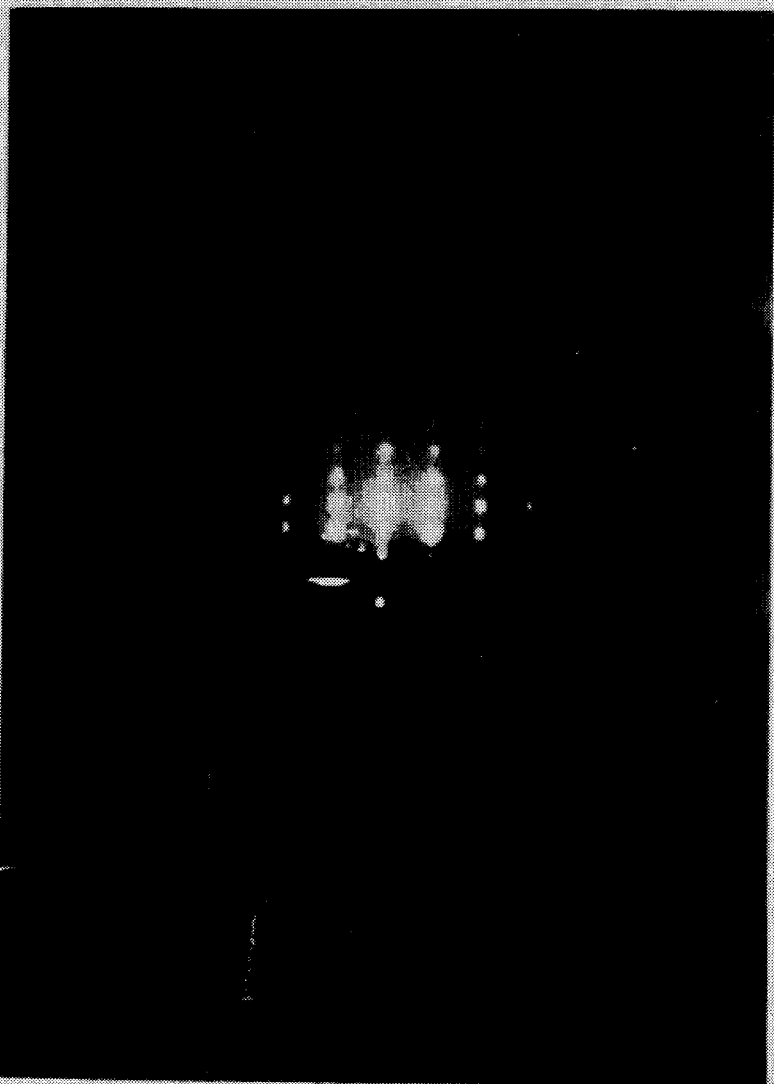
FIG. 24 is a photograph (duplicate) showing results of RHEED (reflection high-energy electron diffraction) analysis of a ZnO film (electron beam is incident in a [11$\bar{2}$0] direction) constituting an orientational substrate obtained in an Example of the present invention appearing hereinafter.
Figure 25:
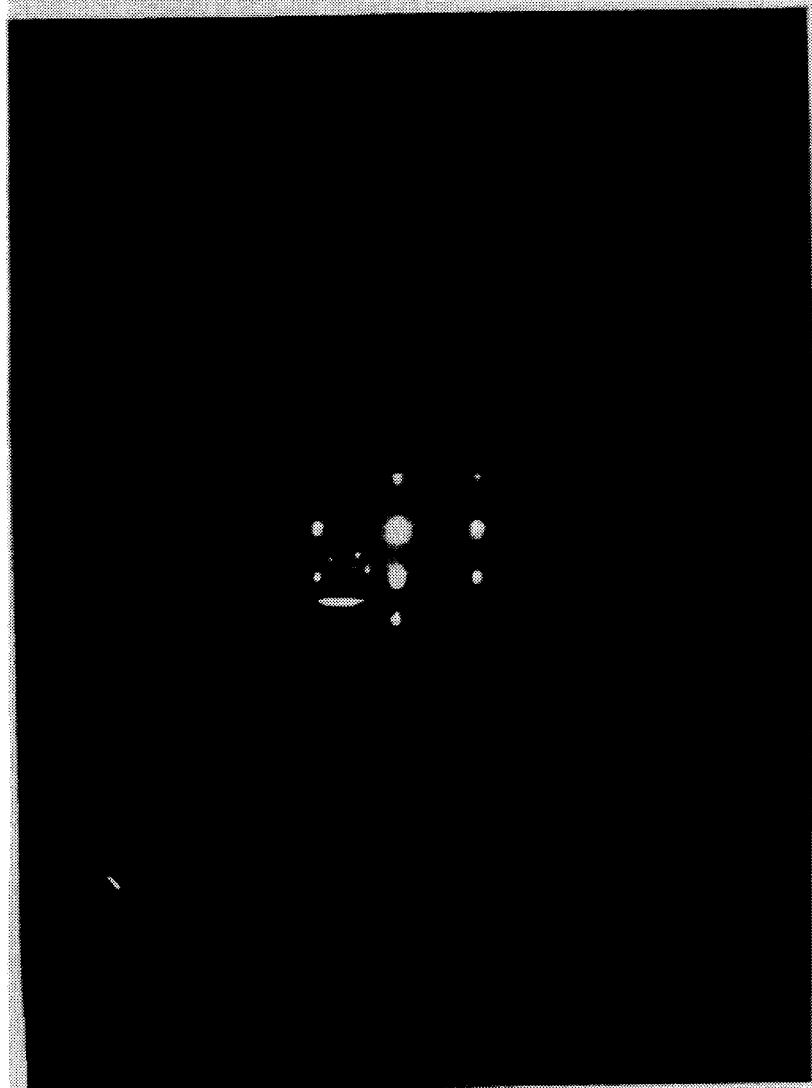
FIG. 25 is a photograph (duplicate) showing results of RHEED analysis of a ZnO film (electron beam is incident in a [10$\bar{1}$0] direction) constituting an orientational substrate obtained in an Example of the present invention appearing hereinafter.

A ZnO film (thickness: 7,000 Å) was epitaxially grown on (111) monocrystailine diamond, thereby to provide an orientational material according to the present invention.
<Conditions for formations of ZnO Epitaxial Film>
RF Magnetron Sputtering Apparatus
Ar : O$_2$=60:40
Gas Pressure: 0.02 Torr
RF Power: 50 to 100 W
Substrate Temperature: 260° C.
Film Thickness: 0.7 μm The thus obtained ZnO film was analyzed by RHEED (Reflection High-Energy Electron Beam Diffraction). As a result, photographs (duplicate is shown) as shown in FIG. 24 (incident direction of electron beam: [11$\bar{2}$0] direction) and FIG. 25 (incident direction of electron beam: [10$\bar{1}$0] direction) were obtained.

The RHEED used herein is a technique of electron beam diffraction, i.e., a method wherein a diffraction pattern of electron based on scattering on the surface of a substance is observed by using a fluorescent screen disposed in the rear side.

Figure 26:
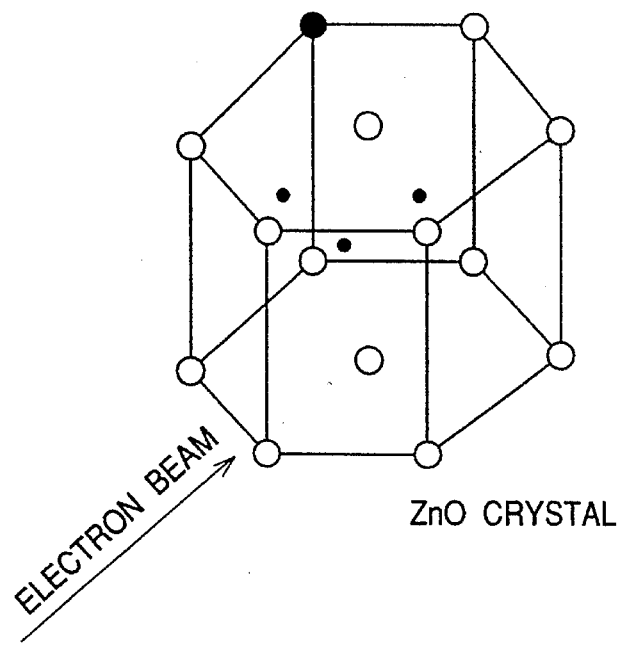
FIG. 26 is a schematic perspective view of ZnO crystal for illustrating an incident direction of an electron beam used in the RHEED.
Figure 28:
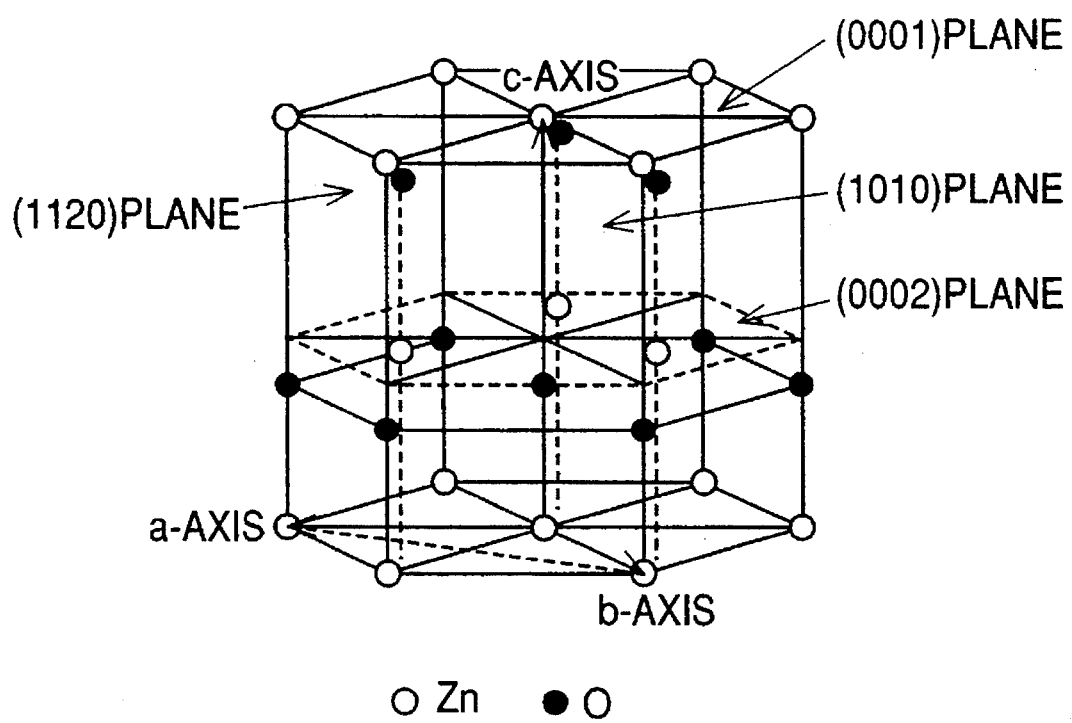
FIG. 28 is a schematic perspective view showing a wurtzite crystal structure.

In the RHEED used in this Example, an electron beam was horizontally incident on the sample. Accordingly, the electron beam was horizontally incident on the (001) plane of the c-axis oriented film of the above ZnO film as shown in a schematic perspective view of FIG. 26 (and FIG. 28).

Figure 27:
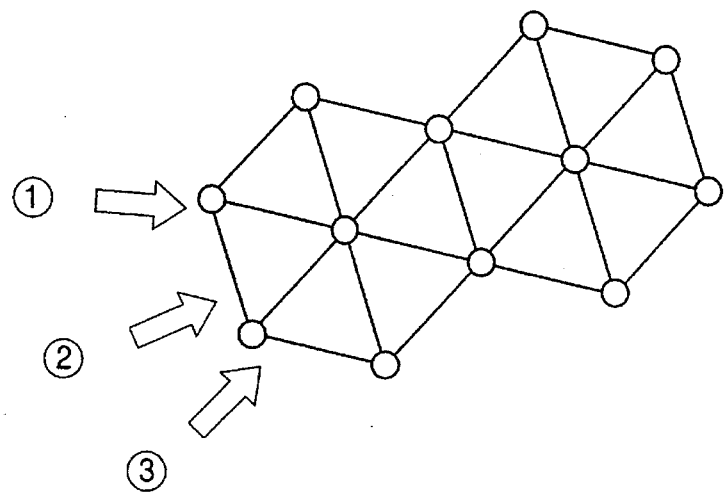
FIG. 27 is a schematic plan view of a ZnO crystal for illustrating an incident direction of an electron beam used in the RHEED.
Figure 29:
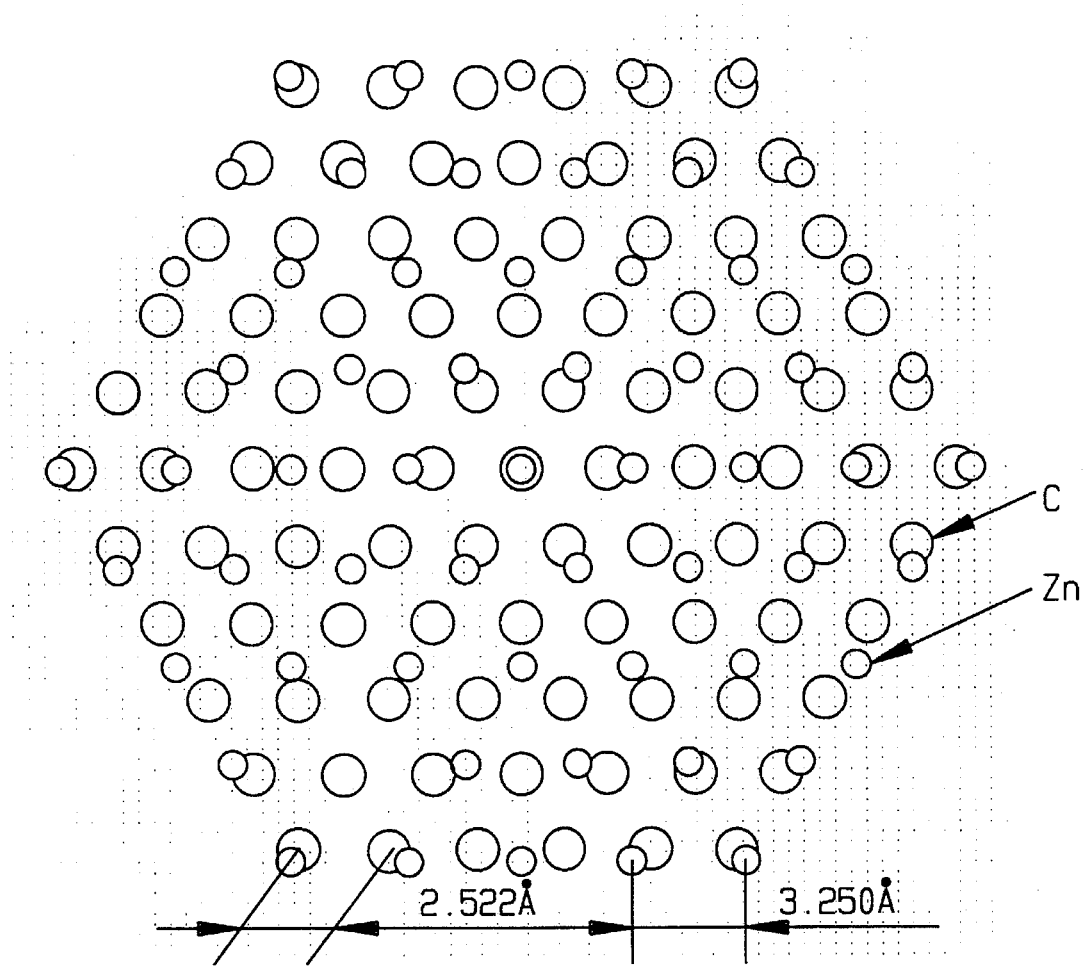
FIG. 29 is a schematic plan view (projection view) showing a combination of a (0001) plane of ZnO and a (111) plane of diamond.
Figure 30:
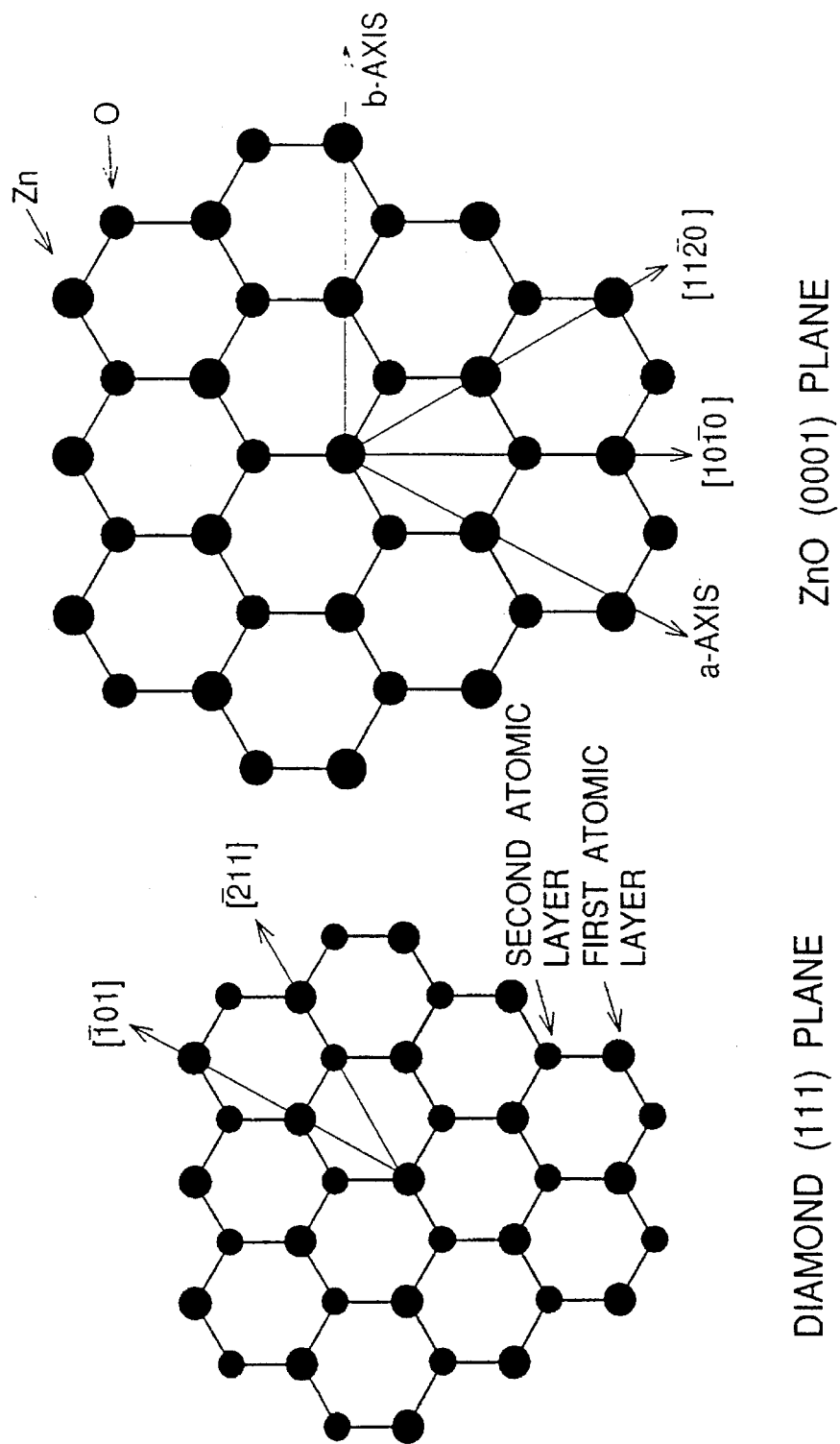
FIG. 30 is a schematic plan view showing a (0001) plane of ZnO and a (111) plane of diamond.

The atomic arrangement of the (001) plane (or (002) plane) of ZnO crystal is shown in plan views of FIGS. 27, 29 and 30. Referring to FIG. 27, the distance between atoms constituting the crystal is different between cases where the crystal is observed from the position denoted by "1", and is observed from the position denoted by "2" in this Figure. However, when the crystal is observed from the position denoted by "3"0 in this Figure, the distance between atoms can be the same as that observed from the above position denoted by "1". Accordingly, in the RHEED analysis for a monocrystalline substance, it was confirmed that the crystal was observed from only two directions of the direction denoted by "1" ( i. e., [11$\bar{2}$0] direction) and the direction denoted by "2" (i.e., [10$\bar{1}$0] direction), since no distance between atoms other than the distances to be observed from the above-mentioned directions denoted by "1" and "2" was present in a monocrystalline substance.

Incidentally, the above FIG. 29 is a view of the (0001) plane of ZnO crystal viewed from above. Since FIG. 29 is a projection view viewed form above, information other than that on the (0001) plane is also shown therein.

As described hereinabove, in the present invention, a film of ZnO having a function as a piezoelectric substance, etc. is formed on a surface of monocrystalline or polycrystalline diamond having a (111) orientational property, and therefore a higher c-axis orientational property than that of the same substance formed on diamond surfaces having the other orientations.

In addition, according to the present invention, good crystallinity may be provided on the basis of the above-mentioned orientational property, and the surface roughness of the resultant ZnO film can also be reduced. Accordingly, there may be provided an orientational material or substrate which may suitably be used as an element or component for forming a variety of dynamical, electric, electronic, and/or optical devices.

When a SAW device is provided by using the orientational material or substrate according to the present invention, there may be provided a SAW device which is capable of being operated while effectively reducing the transmission loss of SAW.

The basic foreign Application filed on Mar. 25, 1994, No. 79883/1994 (i.e., Hei 6-79883) in JAPAN is hereby incorporated by reference.

In addition, "Diamond Thin Film", written by Tadao Inuzuka, pp. 99–115, 1990, published by Kyoritsu Shuppan (Tokyo, JAPAN) is hereby incorporated by reference.

Many modifications of the present invention may be made without departing from the essential scope thereof. It should be understood that the present invention is not limited to the specific embodiments as described.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A material comprising: polycrystalline diamond, and a ZnO film disposed on a surface of (111) orientational diamond provided by the polycrystalline diamond which has an X-ray diffraction intensity of (220) plane which is no more than 13 when normalized as an X-ray diffraction intensity of (111) plane to be 100.

2. A substrate comprising: a polycrystalline diamond layer, and a ZnO film disposed on a surface of (111) orientational diamond provided by the polycrystalline diamond layer which has an X-ray diffraction intensity of (220) plane Which is no more than 13 when normalized as an X-ray diffraction-intensity of (111) plane to be 100.

3. A surface acoustic wave device, comprising: a polycrystalline diamond layer, a ZnO film disposed on a surface of (111) orientational diamond provided by the polycrystalline diamond layer which has an X-ray diffraction intensity of (220) plane which is no more than 13 when normalized as an X-ray diffraction intensity of (111) plane to be 100, and an interdigital transducer disposed on the ZnO film.

4. A surface acoustic wave device according to claim 3, which further comprises an upper layer comprising at least one substance selected from the group consisting of SiO$_2$, diamond, and diamond-like carbon, which is disposed on the interdigital transducer.

5. A surface acoustic wave device according to claim 4, which further comprises a short-circuiting electrode disposed on the upper layer.

6. A surface acoustic wave device, comprising: a polycrystalline diamond layer, an interdigital transducer disposed on a surface of (111) orientational diamond provided by the polycrystalline diamond layer which has an X-ray diffraction intensity of (220) plane which is no more than 13 when normalized as an X-ray diffraction intensity of (111) plane to be 100, and a ZnO film disposed on the interdigital transducer.

7. A surface acoustic wave device according to claim 6, which further comprises a short-circuiting electrode disposed on the ZnO film.

8. A surface acoustic wave device according to claim 6, which further comprises an upper layer comprising at least one substance selected from the group consisting of SiO$_2$, diamond, and diamond-like carbon, which is disposed on the ZnO film.

9. A surface acoustic wave device according to claim 8, which further comprises a short-circuiting electrode disposed on the upper layer.

10. A surface acoustic wave device, comprising: a polycrystalline diamond layer, an interdigital transducer comprising semiconductive diamond and disposed on a surface of (111) orientational diamond provided by the polycrystalline diamond layer which has an X-ray diffraction intensity of (220) plane which is no more than 13 when normalized as an X-ray diffraction intensity of (111) plane to be 100, and a ZnO film disposed on the interdigital transducer.

11. A surface acoustic wave device according to claim 10, which further comprises a short-circuiting electrode disposed on the ZnO film.

12. A surface acoustic wave device according to claim 10, which further comprises an upper layer comprising at least one substance selected from the group consisting of SiO$_2$, diamond, and diamond-like carbon, which is disposed on the ZnO film.

13. A surface acoustic wave device according to claim 12, which further comprises a short-circuiting electrode disposed on the upper layer.

14. A surface acoustic wave device, comprising: a polycrystalline diamond layer; an interdigital transducer comprising a conductive substance and disposed in an indentation of a surface of (111) orientational diamond provided by the polycrystalline diamond layer which has an X-ray diffraction intensity of (220) plane which is no more than 13 when normalized as an X-ray diffraction intensity of (111) plane to be 100; and a ZnO film disposed on the interdigital transducer.

15. A surface acoustic wave device according to claim 14, which further comprises a short-circuiting electrode disposed on the ZnO film.

16. A surface acoustic wave device according to claim 14, which further comprises an upper layer comprising at least one substance selected from the group consisting of SiO$_2$, diamond, and diamond-like carbon, which is disposed on ZnO film.

17. A surface acoustic wave device according to claim 16, which further comprises a short-circuiting electrode disposed on the upper layer.

18. A surface acoustic wave device, comprising: a polycrystalline diamond layer; a short-circuiting electrode disposed on a surface of (111) orientational diamond provided by the polycrystalline diamond layer which has an X-ray diffraction intensity of (220) plane which is no more than 13 when normalized as an x-ray diffraction intensity of (111) plane to be 100; a ZnO film disposed on the short-circuiting electrode; and an interdigital transducer disposed on the ZnO film.

19. A surface acoustic wave device according to claim 18, which further comprises an upper layer comprising at least one substance selected from the group consisting of SiO$_2$, diamond, and diamond-like carbon, which is disposed on the interdigital transducer.

20. A surface acoustic wave device according to claim 19, which further comprises a short-circuiting electrode disposed on the upper layer.

21. A surface acoustic wave device, comprising: a polycrystalline diamond layer; a ZnO film disposed on a surface of (111) orientational diamond provided by the polycrystalline diamond layer which has an X-ray diffraction intensity of (220) plane which is no more than 13 when normalized as an X-ray diffraction intensity of (111) plane to be 100; an upper layer comprising at least one substance selected from the group consisting of SiO$_2$, diamond and diamond-like carbon, which is disposed on the ZnO film; and an interdigital transducer disposed on the upper layer.

22. A surface acoustic wave device, comprising: a polycrystalline diamond layer; a short-circuiting electrode disposed on a surface of (111) orientational diamond provided by the polycrystalline diamond layer which has an X-ray diffraction intensity of (220) plane which is no more than 13 when normalized as an X-ray diffraction intensity of (111) plane to be 100; a ZnO film disposed on the short-circuiting electrode; an upper layer comprising at least one substance selected from the group consisting of SiO$_2$, diamond, and diamond-like carbon, which is disposed on the ZnO film; and an interdigital transducer disposed on the upper layer.

23. A surface acoustic wave device, comprising: a polycrystalline diamond layer; a ZnO film disposed on a surface of (111) orientational diamond provided by the polycrystalline diamond layer which has an X-ray diffraction intensity of (220) plane which is no more than 13 when normalized as an X-ray diffraction intensity of (111) plane to be 100; a short-circuiting electrode disposed on the ZnO film; an upper layer comprising at least one substance selected from the group consisting of SiO$_2$, diamond, and diamond-like carbon, which is disposed on the short-circuiting electrode; and an interdigital transducer disposed on the upper layer.

24. A surface acoustic wave device, comprising: a polycrystalline diamond layer; a first ZnO film disposed on a surface of (111) orientational diamond provided by the polycrystalline diamond layer which has an X-ray diffraction intensity of (220) plane which is no more than 13 when normalized as an X-ray diffraction intensity of (111) plane to be 100; an interdigital transducer disposed on the first ZnO film; and a second ZnO film disposed on the interdigital transducer.

25. A surface acoustic wave device as in any of claims 3–24, in which said ZnO film has a standard deviation of rocking curve which is no more than 1.34 as measured by using an X-ray diffraction method.

* * * * *